US006448852B1

(12) United States Patent
Compton et al.

(10) Patent No.: US 6,448,852 B1
(45) Date of Patent: Sep. 10, 2002

(54) BATTERY POLARITY INSENSITIVE INTEGRATED CIRCUIT AMPLIFIER

(75) Inventors: James Barclay Compton, Los Gatos; Clyde "Kip" M. Brown, Jr., Cupertino, both of CA (US)

(73) Assignee: The Engineering Consortium, Inc., Santa Clara, CA (US)

( * ) Notice: Subject to any disclaimer, the term of this patent is extended or adjusted under 35 U.S.C. 154(b) by 77 days.

(21) Appl. No.: 09/726,232

(22) Filed: Nov. 29, 2000

Related U.S. Application Data

(62) Division of application No. 09/149,927, filed on Sep. 9, 1998.

(51) Int. Cl.[7] .......................... H03F 3/217; H03F 21/00; H01L 29/00
(52) U.S. Cl. ..................... 330/251; 339/207 A; 257/532
(58) Field of Search .............................. 330/207 A, 251; 257/532, 533; 365/185

(56) References Cited

U.S. PATENT DOCUMENTS 5,677,867 A * 10/1997 Hazani ................. 365/185.01
5,795,804 A * 8/1998 Jenq ............................ 438/244
5,883,833 A * 3/1999 Naura et al. ............ 365/185.18

* cited by examiner

*Primary Examiner*—Robert Pascal
*Assistant Examiner*—Patricia Nguyen
(74) *Attorney, Agent, or Firm*—Coudert Brothers LLP

(57) ABSTRACT

A compact polarity-insensitive integrated circuit amplifier is described designed to be powered by a miniature low voltage battery of variable polarity. Low current, polarity corrected voltage sources are integrated into functional blocks to supply low current non-bidirectional elements and to provide a constant polarity bias to a substrate of CMOS circuits. Polarity corrected voltage sources are used to provide a polarity sensing function. The invention is embodied in a Class D amplifier which may comprise four n-channel MOSFET transistors arranged in an H-bridge configuration. Additional driver circuitry is described which increases the voltage of the pulse-width modulated input signal to the MOSFET transistors and also performs a pulse trimming function, which reduces parasitic crowbar currents in the amplifier output stage.

4 Claims, 15 Drawing Sheets

BATTERY POLARITY INSENSITIVE INTEGRATED CIRCUIT AMPLIFIER

This application is a divisional of Application No. 09/149,927, filed Sep. 9, 1998.

FIELD OF THE INVENTION

The present invention is generally directed to compact integrated circuit amplifiers designed to be powered by a single low-voltage battery and more specifically to compact high performance hearing aids designed to fit in the ear canal.

BACKGROUND OF THE INVENTION

There is a general trend towards the miniaturization of a variety of battery-powered electronic devices. Extreme miniaturization of battery powered electronic devices forces designers to use a single miniature battery to achieve a reduction in the size of the entire device. Currently, hearing aids constitute a class of consumer electronic devices in which extreme miniaturization requires the use of a single miniature battery. However, there is a general trend to miniaturize many consumer electronic devices, such as portable stereo listening devices and pagers. Also, it is desirable to miniaturize many health-related electronic devices, such as on-patient medical monitoring devices which monitor heart rate or other life functions.

However, miniature batteries present numerous technical problems. The total stored energy in a battery decreases as the battery volume is decreased. The series resistance of the battery also increases as the battery size (diameter) is reduced. Also, miniature batteries typically contain only one electrolytic cell. A single electrolytic cell has a characteristic maximum source voltage. Typically, the voltage of a miniature battery during its useful lifetime is only slightly more than one volt depending upon the "freshness" of the battery.

The high series resistance and low source voltage of a miniature battery confronts circuit designers with difficult problems in designing efficient circuits which operate properly under these conditions. Commonly, complimentary metal oxide semiconductor (CMOS) integrated circuits, such as microprocessors, are designed to operate from a five volt power supply of constant polarity. Some high performance microprocessors are designed to operate from a three volt power supply. However, a miniature battery with a single electrolytic cell has a source voltage which is never substantially more than about 1.6 volts even when the battery is fresh. Consequently, many common CMOS circuits cannot be directly powered from a miniature battery. Generally, low voltage CMOS circuit design requires different design considerations compared with conventional CMOS circuit design.

Hearing aids are one example of an electronic device in which miniaturization of the total device size requires circuit designers to use a single miniature battery. A new generation of so-called "cosmetically-pleasing" miniature hearing aids is extremely popular. These miniature hearing aids include in-the-ear, in-the-canal, and completely in-the-canal hearing aids. Miniature hearing aids are largely or completely unobservable by others. Moreover, the placement of a miniature hearing aid within the ear canal provides several potential performance advantages, such as a reduction in distortion and noise, improved fidelity, and greater user comfort. Miniature hearing aids are one of the fastest growing areas of the hearing aid market.

Miniature hearing aid designers place a great emphasis in circuit design in allocating the use of limited space and battery power to efficient sound amplification. Many circuit designs which would be practical with a source voltage of 2 V to 3 V are not possible to achieve with a 1.1 V battery. For example, common diode protection circuits to guard against improper insertion of the battery are not feasible with miniature hearing aid batteries. Diode protection circuits are commonly used in many CMOS applications to protect against improper battery insertion. A diode typically has a 0.5-to-0.6 Volt turn-on voltage in the forward direction and is substantially non-conducting in the reverse direction up to a reverse-bias breakdown voltage (e.g., ten Volts). A diode protection circuit permits current flow when the battery is inserted with proper polarity but prevents current flow if the battery is incorrectly inserted. However, with a miniature hearing aid the 0.6 V voltage drop created by a diode protection circuit may render the rest of the CMOS circuit inoperable because the net operating voltage (e.g., 1.1 V–0.6 V=0.5 V) at best barely exceeds the threshold voltage of a single CMOS transistor. In the worst case, a diode protection circuit would cause such a severe voltage drop that the net operating voltage would be below the threshold voltage of a single transistor, making it impossible to design functional transistor circuits directly powered from the battery.

Low-voltage CMOS circuit design involves numerous tradeoffs related to the fact that the available supply voltage is too low to drive MOSFET transistors well into the saturation region. MOSFET transistor switches can only be driven into a high-conductivity ohmic regime if the effective supply voltage is significantly higher than the threshold voltage. As is well known, MOSFET transistors have several distinct operating regimes. There is a linear regime, corresponding to low drain-source voltages and/or low gate voltages. The drain current in the linear regime is commonly expressed by the mathematical equation: $I_d=2\ k[(V_{GS}-V_T)V_{DS}-0.5\ V_{DS}^2]$, where $I_d$ is the drain current, $V_{GS}$ is the gate source voltage, $V_T$ is the threshold voltage, $V_{DS}$ is the drain-source voltage, and k is a constant. In the saturation regime, generally corresponding to higher drain-source voltages and gate-source voltages, the drain current is expressed by the mathematical equation: $I_d=k[(V_{GS}-V_T)^2]$. This saturation regime is also sometimes referred to as an ohmic region. Generally, it is difficult to drive a CMOS transistor into the ohmic region with a voltage source of less than about two volts. In particular, a gate-source voltage less than 1.1 volts is not consistent with a strong enhancement mode of operation because the quantity $V_{GS}-V_T$ is too small.

Circuit designers designing CMOS circuits powered by 1.1 V hearing aid batteries must substantially redesign traditional CMOS circuits to minimize voltage drops between the battery and power amplification circuits. Low voltage CMOS transistors typically have a threshold voltage of approximately 0.4 to 0.6 volts. The drain-source voltage is preferably greater than 100 mV above the threshold voltage to achieve a strongly inverted channel. Consequently, it is difficult to operate more than two strongly inverted transistors in series with a 1.1 V battery because the available battery voltage (1.1 V) is just barely enough to bias two transistors to the strongly inverted channel regime (because 2×0.5 V=1.0 V). In some cases, there is insufficient voltage to drive even two transistors in series to the strongly inverted channel regime. Generally, for a low battery voltage it is difficult to achieve a large enough gate-source voltage to switch MOSFET transistors from fully-on to fully-off states.

Miniature hearing aids are also expensive, typically costing up to two-thousand dollars, which limits their widespread use. Part of the high cost of state-of-the-art miniature hearing aids is a result of the fact that the various components of typical behind-the-ear hearing aid circuits, such as input filters, analog amplifiers, digital electronic elements, filter circuits, and power supply protection circuits, cannot be straightforwardly integrated together because of fundamental incompatibilities (e.g., size limitations, voltage drops, and the problem of achieving a self-consistent (CMOS design architecture). As a result, hybrid manufacturing processes are typically used to combine the function of different chips and discrete circuit elements together. Hybrid techniques, such as wirebonding or soldering different discrete components such as discrete capacitors, filters, amplifiers, and power supply protection circuits together requires labor intensive and space consuming procedures, such as mounting the components in close proximity to one another and wirebonding or soldering, electrical connections between the components.

The low battery voltage of miniature batteries also makes it difficult to achieve a high level of sound amplification. The power of an amplified signal depends upon the square of the voltage of the amplified signal. Consequently, it is difficult to design powerful amplifiers if the available supply voltage is low, since this limits the maximum potential output voltage swing of the amplifier. Additionally, the maximum voltage swing may be limited by other effects, such as noise and distortion considerations. For example, linear audio amplifiers used in hearing aids typically have a poor power conversion efficiency if they are operated in a voltage regime along the load line of the amplifier where harmonic distortion is acceptably low.

Class D amplifiers have many potential performance advantages compared with linear amplifiers, such as the potential for higher power conversion efficiency and higher power output. Class D operation is typically achieved by configuring four transistor to operate in a voltage switch-mode of operation in which diagonal pairs of transistors are alternately switched on and off. Class D amplifiers typically use complementary transistor pairs consisting of four switches, two of which have the equivalent of inverted inputs by virtue of a change in transistor type.

In Class D amplifier technology, a linear signal is first converted into a pulse width modulated (PWM) signal so that the input signal strength is proportional to the width of the pulse. Preferably, the PWM input signal is amplified across a range corresponding to both the positive and negative battery potential (so-called "rail-to-rail" amplification). For example, the PWM signal may be split to drive two inverter chains. The PWM signal and inverted PWM signal may be used as inputs to an H-bridge amplifier comprised of complementary n-channel and p-channel transistors. When the PWM signal is "high" one set of complementary transistors switches on such that the output voltage is raised to the positive rail voltage. When the PWM signal is "low," the other set of complementary transistors is switched on such that the output voltage is switched to the negative rail voltage. In theory, this rail-to-rail mode of amplification may increase the maximum power output of a hearing aid by a factor of four, since the amplifier is operated across a voltage range corresponding to twice the battery voltage (i.e., $\pm V_b$, where $V_b$ is the battery voltage). The amplified PWM signal may then be converted back into a linear signal using integrator techniques (typically by using the hearing aid receiver coil as the integrator to smooth out the high frequency PWM signal components).

Unfortunately, it is difficult to effectively use Class D amplifier circuits in integrated hearing aid circuits. Efficient "rail-to-rail" amplification using Class D amplifiers requires that the transistors switches have a low on-resistance. In theory, a power conversion efficiency in excess of 90% is possible if the effective on-resistance of the switches is sufficiently low. However, the nominal battery voltage (1.1 V) is only slightly above typical n-channel and p-channel MOSFET turn-on voltages (e.g., about 0.5 V). As is well known, MOSFET circuits which are only weakly driven above their threshold voltage have a substantial resistance per unit of gate width. Consequently, there is an important tradeoff between the size of a H-bridge amplifier and its power conversion efficiency. Typically, it is difficult to simultaneously achieve both a compact size and a high power conversion efficiency for a H-bridge amplifier powered by a low-voltage battery.

The low efficiency of sound amplification and small battery size limit the lifetime of hearing aid batteries. Hearing aid batteries typically have a useful lifetime in excess of one-hundred hours. The short battery lifetime is partially a consequence of the small battery size alone, which reduces the maximum stored energy and increases the battery resistance. The problem of short battery-lifetime is further compounded by the relatively low efficiency of sound amplification that can be achieved with conventional linear amplifiers because of the low source voltage (typically less than 1.1 Volts) and high battery resistance of miniature batteries.

The frequent battery replacement in miniature hearing aids is both costly and inconvenient to the user. Frequent battery replacement can also be frustrating to users because the batteries used in miniature hearing aids are so small that it is easy for users to insert the battery with the wrong polarity. This is a problem because a significant fraction of the users of such hearing aids have poor close-up vision, poor hand coordination, or poor finger dexterity. Even if the electronics are not damaged by incorrectly inserting the battery, the user still has the frustration of having to frequently re-insert a small battery to attain the correct polarity. Moreover, frequent re-insertion of the battery increases the likelihood that portions of the battery case, such as plastic lip-regions, may be damaged.

Miniature hearing aids would thus be more convenient to use if a compact battery polarity correction circuit could be integrated with other electronics so that the hearing aid would function properly regardless of which direction the battery was inserted. Additionally, a battery polarity correction circuit could potentially increase battery lifetime. The size of miniature hearing aid batteries is so small that the battery must be shaped and/or imprinted to aid users in visually distinguishing the polarity of the battery. Common methods, such as shaping one end of a battery and imprinting "plus" and "minus" signs on the battery terminals to facilitate correct battery insertion use upwards of 20% of the available battery volume and reduce battery capacity compared to a battery shaped as a true cylinder with the same maximum diameter and maximum height. Also, a significant portion of the cost of manufacturing miniature batteries is associated with the cost of machining the shaped end. A low resistance battery polarity correction circuit would permit less expensive blank-faced batteries with a significantly longer lifetime to be used.

An efficient miniature hearing aid with a battery polarity correction function would make battery replacement both a less burdensome and more infrequent chore for the hearing aid user. A highly desirable miniature hearing aid would integrate together battery polarity adjustment circuits, efficient Class D amplifiers, and other valuable electronic functions into one compact circuit in order to permit longer battery life, increased functionality, lower manufacturing costs, and to make the hearing aid more convenient for the user.

Unfortunately, the small size of miniature hearing aids combined with the low voltage of the battery makes it difficult to integrate together a voltage polarity correction function, an efficient amplifier, and other hearing aid electronics into a miniature hearing aid. It is desirable that the hearing aid amplifier and receiver is designed to fit into the ear canal in order to achieve a reasonable acoustical coupling of sound emitted from the hearing aid into the cochlea. Although there are individual variations in size and shape, the human ear canal is generally S-shaped and has a first bend region and a second bend region. The cross-sectional diameter of the human ear canal also varies along its length. The industry standard is that the electronics package designed to fit close to the ear drum (i.e., about 0.100" from the ear drum) should be a rectangular package no larger than about 0.090" thick, 0.110" wide, and 0.200" long. This space constraint makes it difficult to achieve circuits in which the individual transistors are wide enough to have a low resistance when driven by a 1.1 V battery. As is well known by those skilled in the art, CMOS transistors which are biased only slightly above threshold have a non-negligible resistance per unit of gate width. Consequently, the transistors in Class D amplifiers and in polarity corrected voltage sources must be made extremely wide in order to achieve a reasonable series resistance for the integrated circuit and to maintain a sufficiently high operating voltage. Although the circuit area of previously known H-bridge hearing aid amplifiers varies somewhat, U.S. Pat. No. 4,592,087, describes CMOS Class D amplifiers driven off of 1.2–1.5 V batteries which have a circuit area of 0.075"×0.090" (with a corresponding thickness of 0.009"). Previously known battery polarity correction circuits commonly utilize a four transistor bridge-type circuit. However, in order to achieve a low series resistance of the polarity correction circuit, the transistors are typically quite large. For example, commercially available battery polarity correction circuits typically have a circuit area of 0.140"×0.100" (with a die thickness of 0.010") in order to achieve a series resistance of 3.5 ohms.

Another obstacle to directly integrating a voltage polarity correction function with a Class D amplifier is the potential noise problem created by directly integrating power supply correction circuits that drive all of the hearing aid electronics. For example, if Class D amplifiers are used to drive the speaker of a miniature hearing aid, the amplifier section will consume large pulsed currents compared to other electronic components, such as small signal linear pre-amplifiers. The large difference in the load current of the Class D amplifier compared to other sections driven off of the common battery will produce spike noise, which can severely degrade the performance of all preceding amplifiers or require sophisticated circuit techniques to manage this effect. Additionally, there typically are other parasitic currents in the amplifier structure which further exacerbate the problem of spike noise. It is difficult, given the limited available room, to incorporate sufficiently large integrated or discrete capacitors, such as 5–10 μF capacitors, to effectively filter the small signal loads from the spike noise. Additionally, the series resistance of a battery polarity correction circuit contributes to the problem of spike noise. As described above, even comparatively large polarity correction circuits have a series resistance of 3.5 ohms. This is comparable to the resistance of a miniature battery. The effective series resistance of the equivalent voltage source is at least doubled, which causes a corresponding increase in spike noise if a Class D amplifier is driven off of the polarity corrected voltage source Still another obstacle to directly integrating a voltage polarity correction function and a Class D amplifier is caused by substrate biasing problems. CMOS transistor circuits require that a correct polarity be maintained not just for the source and drain contacts of each transistor but also for the entire substrate contact. CMOS battery polarity correction circuits have the two battery terminals as circuit inputs and also have one battery terminal connected to the substrate. In response, the battery polarity correction circuit produces a "high" terminal" output and a "low" terminal output whose polarity is constant regardless of which direction the battery is inserted into the hearing aid. As is disclosed in U.S. Pat. No. 5,661,420, the two outputs of a battery polarity correction circuit on a first chip can be used to drive amplifier sections on a second chip by mounting the polarity correction circuit such that its two outputs form the inputs to subsequent amplifiers on another substrate. However, direct integration of such a battery polarity correction circuit with a CMOS-based amplifier on the same chip is frustrated by the fact that the substrate voltage is still determined by the battery polarity because the circuits share a common substrate. Even if the high and low input voltages to the amplifier from the battery polarity correction circuit remain constant regardless of battery polarity, the CMOS circuits of many amplifiers would not function properly.

As is well known in the art of CMOS circuit design, a change in the polarity of the substrate bias may shift the threshold voltage of CMOS transistors, which is an especially serious problem in low-voltage applications where key transistors may be only slightly driven above threshold. A commonly used first-order approximation is that the threshold voltage shifts according to the square root of the substrate-source bias, $V_{BS}$. However, for the case where $V_{BS}$ is comparatively low, a more accurate analysis is required using equations well known to those or ordinary skill in the art. The threshold voltage will depend upon the MOSFET doping and also upon the source-to-drain distance. Calculations by the inventors indicate that for common MOSFET doping choices that a 0.9-to-1.6 V substrate bias produces a shift in threshold of about 0.13-to-0.15 V. This shift is significant if the MOSFET transistors are barely biased to the ohmic regime. However, even if the transistors are biased into the ohmic regime, a significant change in transistor current and on-resistance may still occur. The drain-source resistance of a MOSFET transistor with a low drain-source voltage may be approximated as being inversely proportional to $V_{GS}-V_T$. If the gate source voltage is low (e.g., less than about 1.1 Volts), then with common threshold voltages of about 0.5 Volts, a change in substrate bias polarity can produce over a 25% change in on-resistance of a MOSFET.

It is desirable that a miniature hearing aid integrated circuit integrates a compact efficient Class D amplifier, a battery polarity correction function, and other valuable electronics into a circuit suitable for miniature hearing aid applications. However, there is an inherent contradiction to directly integrating a voltage polarity correction function with a Class D amplifier suitable for miniature hearing aid applications using previously known design approaches. The low-voltage power supply imposes one set of important design constraints. Previous CMOS low-voltage design approaches utilize comparatively large transistors to reduce resistive voltage drops. However, circuit size is another important constraint. The total circuit should be no larger than the industry standard for in-the-ear canal designs and is preferably substantially smaller to reduce cost and permit other valuable electronic functions to be incorporated on the same chip. Additionally, the problem of successfully integrating a compact voltage polarity correction function with other circuits on the same chip has not been addressed in previously known design approaches.

Many of the same issues which are currently important for miniature hearing aids are relevant to other consumer electronic devices. For example, many pagers have transducers which make an audible noise or vibrate. As pagers continue to be miniaturized, eventually they will comprise a miniature battery, a low-frequency transducer, and CMOS control circuits. Portable stereos may soon consist of hearing-aid sized units designed to worn in the ear. Generally, there is a wide variety of electronic devices for which further miniaturization will require that a single miniature battery by employed. The same general problem of designing a compact, efficient, high power amplifier circuit driven by a single low voltage battery is common to a variety of these applications. Also, a variety of consumer electronic devices would benefit if miniature blank-faced batteries which offer important advantages in terms of user convenience, battery cost, and battery lifetime, could be utilized.

What is desired is a new integrated circuit design approach which permits an efficient Class D amplifier with battery polarity insensitivity to be achieved in a compact circuit powered by a miniature 1 Volt battery.

SUMMARY OF THE INVENTION

The present invention generally comprises a compact battery polarity insensitive integrated circuit amplifier designed to be powered by a miniature low voltage battery of variable polarity.

One aspect of the present invention is a power management approach which achieves the benefit of polarity insensitivity while permitting a substantial reduction in size compared to conventional polarity correction approaches. Low current, polarity corrected voltage sources are integrated into functional blocks to supply low current non-bidirectional elements and to provide a constant polarity bias to the substrate of CMOS circuits. Additionally, polarity corrected voltage sources are used to provide a polarity sensing function. Reference signals from a polarity corrected voltage source are used by polarity control circuits to achieve a polarity sensing and adjustment function for other circuits. In one embodiment, the polarity control circuit provides control signals to a high conductivity polarity adjustable voltage source so that the polarity adjustable voltage source adjusts its mode of operation to provide a constant polarity output regardless of the actual battery polarity. In a preferred embodiment, the polarity adjustable voltage source comprises four high conductivity n-channel MOSFET transistors and the polarity control circuit includes a voltage multiplier to increase the gate voltages to the n-channel transistors.

Another aspect of the present invention is a compact, efficient Class D amplifier which is compatible with a power source comprising a nominal 1.1 Volt battery of variable polarity. In one embodiment, the Class D amplifier output stage comprises four n-channel MOSFET transistors arranged in an H-bridge configuration. Additional driver circuitry is used to increase the voltage of the pulse width modulated input signal to the MOSFET transistors. The driver circuitry also performs a pulse-trimming function, which reduces parasitic crowbar currents in the amplifier output stage.

Another aspect of the present invention is a compact, efficient voltage multiplier circuit designed to achieve substantial multiplication of a low voltage source. The capacitors of the voltage multiplier circuit have a high capacitance per unit area and a low parasitic capacitance, permitting a substantial reduction in the size of circuitry utilized to achieve a voltage multiplication function. In a preferred embodiment, the capacitor comprises at least one ultra-thin silicon dioxide layer having a thickness less than about 200 Angstroms in thickness in order to achieve a high capacitance per unit area.

Still another aspect of the present invention is an amplifier combining the inventive power management approach, efficient Class D amplifier, and driver circuit with a compact efficient voltage multiplier circuit to achieve a polarity insensitive integrated circuit amplifier which is extremely compact, efficient, and has improved immunity to spike noise. In a preferred embodiment the design of the power management circuit, Class D amplifier, and driver circuit are selected to achieve a battery polarity insensitive Class D amplifier in which the size of the total circuit is substantially reduced compared to conventional Class D amplifiers powered by a miniature battery.

DETAILED DESCRIPTION OF THE INVENTION

The inventors have recognized that conventional Class D amplifiers, voltage polarity correction circuits, and other valuable integrated circuit functions cannot readily be integrated together using previously known design approaches to achieve a compact integrated circuit powered by a nominal 1 V hearing aid battery. The inventors have realized that a new design approach is required to facilitate the integration of valuable electronic functions consistent with the circuit operating properly regardless of the polarity of miniature 1 V hearing aid batteries.

The design approach of the inventors generally comprises 1) an improved power management architecture to achieve a compact polarity correction function; 2) an improved polarity insensitive Class D output stage amplifier which permits a reduction in the size of the Class D amplifier and the polarity correction circuitry; 3) an improved driver circuit utilizing a special capacitor structure to achieve an efficient voltage multiplication function in a compact circuit; and 4) the synergetic combination of the above-described elements to achieve a polarity insensitive Class D amplifier that is significantly smaller than conventional state-of-the art Class D amplifiers lacking a polarity correction function.

Figure 1:
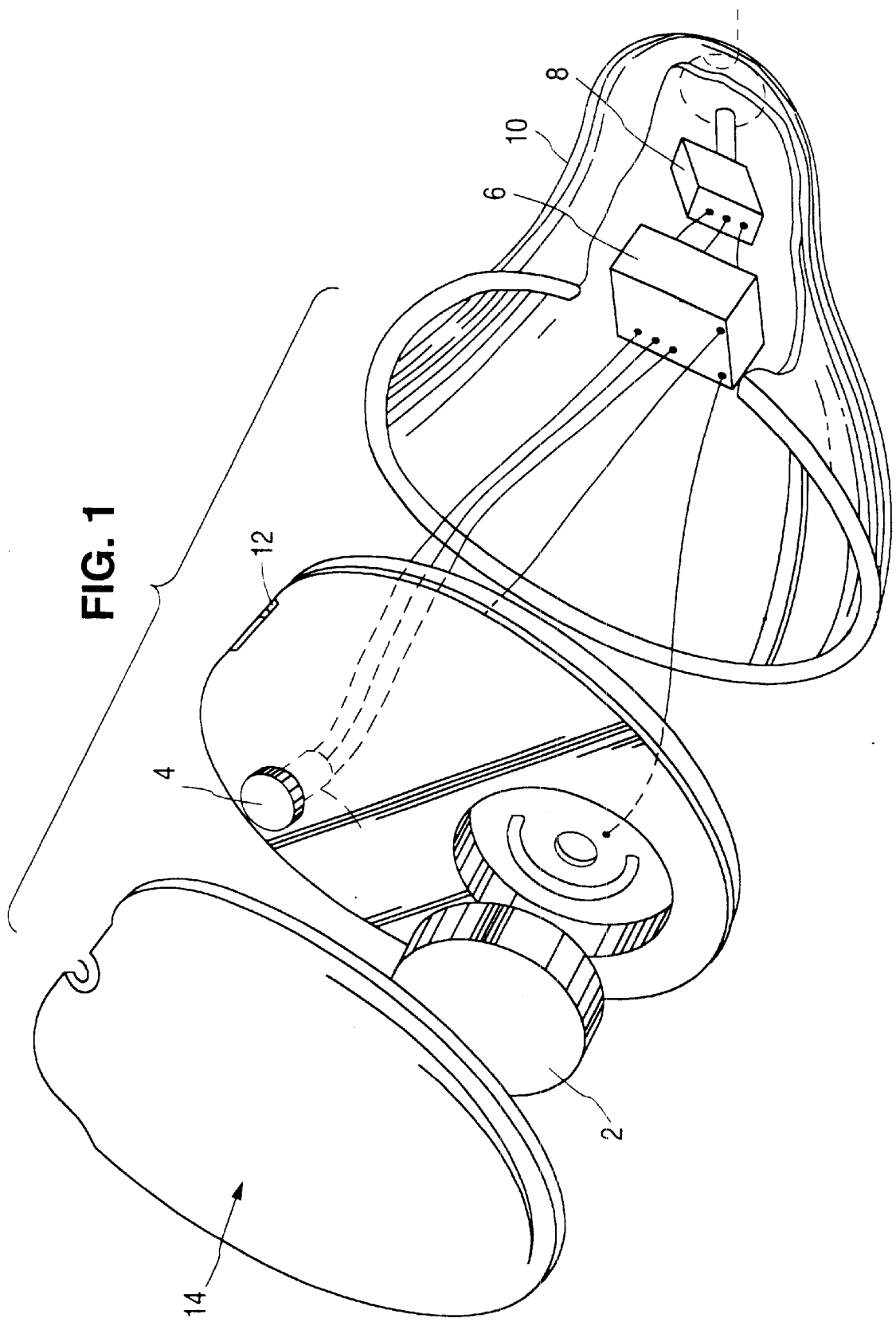
FIG. 1 is a perspective view of a prior art in-the-ear hearing aid.
Figure 2:
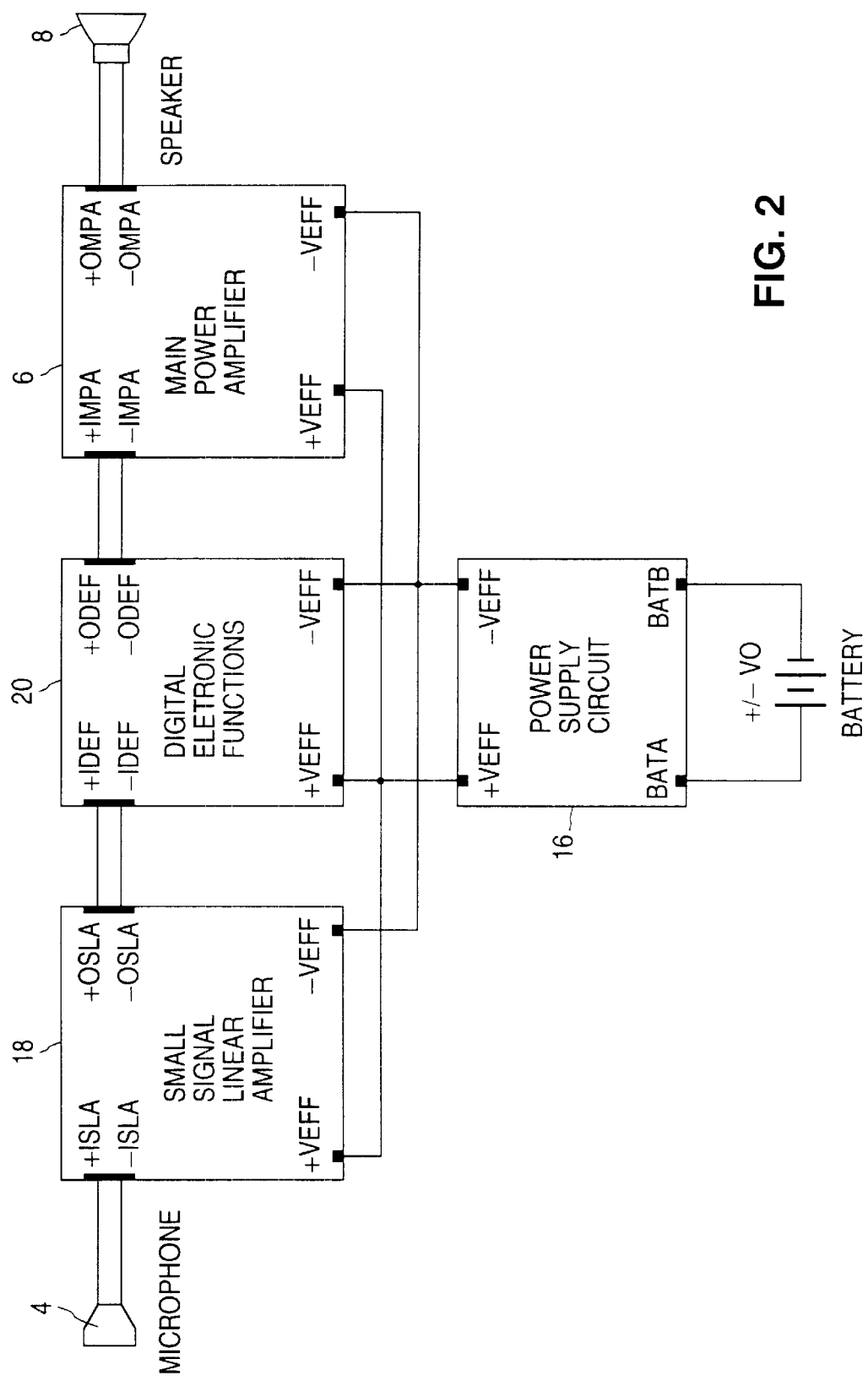
FIG. 2 is a functional circuit block diagram of a hearing aid with using the conventional approach of using a single power supply circuit between the battery and the rest of the hearing aid electronics.

The general problems solved by the present invention are illustrated with regards to FIGS. 1–2. FIG. 1 is a perspective view of a compact prior art hearing aid designed to fit in the ear. Referring to FIG. 1, the hearing aid comprises a battery 2, microphone 4, amplifier electronics 6, and speaker 8. There is also a casing 10, battery compartment 12, and cover 14, to provide a housing for all of the elements of the hearing aid. Advanced hearing aids may also have digital control and digital signal processing elements that modify the response of the amplifier electronics. As is shown in FIG. 1, the components of modern miniature hearing aids typically fill up virtually all of the available space in the hearing aid assembly such that hearing aid designers must make tradeoffs between battery size, circuit size, power consumption, and functionality.

It is highly desirable in a hearing aid to have a battery polarity correction function that permits a hearing aid to function properly regardless of battery polarity. As shown in FIG. 2, one solution to this problem is to use the design approach of standard AC-to-DC power supplies in which a central power supply circuit 16 performs a voltage correction function. A bridge-type circuit with multiple switches can be used to maintain constant polarity of the output voltage regardless of the polarity of the input voltage. The type of bridge circuit switches used to achieve a polarity correction function are well known to those skilled in the art of power supply design, but include bridge circuits with diode and transistor switches. However, as shown in FIG. 2, the use of such circuits as a polarity correction circuit reduces the effective voltage available to the load, $V_{\mathit{eff}}$, below that of the battery voltage, $V_o$. This is because polarity correction circuits typically include bridge circuits in which the current, for a given battery polarity, flows through two of four switches. Each switch has a series resistance, which reduces the voltage available to the load. The switches must typically be made quite large, by the standards of integrated circuit technology, to have a low series resistance. This is essential if the effective voltage available to the load, $V_{\mathit{eff}}$, is to remain high enough for low-voltage CMOS circuits to function properly.

A central power supply circuit 16 also has the problem that all loads are driven off the same smoothing capacitor associated with the power supply circuit 16. As shown in FIG. 2, additional small signal amplifiers 18 and digital electronic functions 20 are connected in parallel to the power supply. Consequently, the current pulses in the main power amplifier 6 can introduce substantial spike noise to the small signal amplifier 18 and disrupt the operation of other electronic elements unless a comparatively large smoothing capacitor (not shown) is included across the output terminals of power supply circuit 16. However, a large value discrete or integrated capacitor is inconsistent with a compact, economical hearing aid design.

Figure 3:
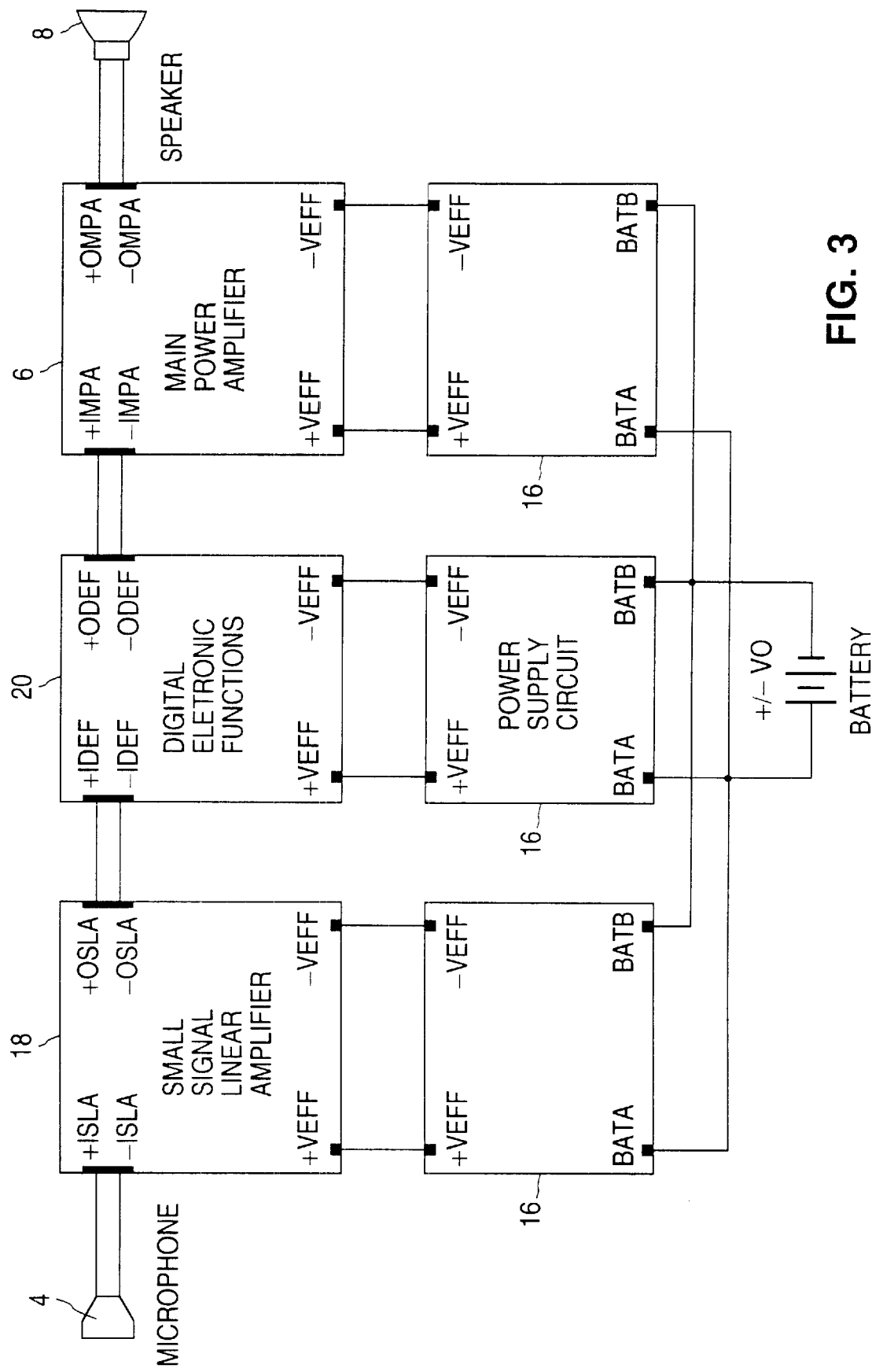
FIG. 3 is a functional circuit block diagram of an inventive hearing aid in which each major functional block has its own power supply correction circuit.

In light of the aforementioned problems, the inventors have realized that a new power management architecture is required which exploits the full potential of integrated circuit technology. As shown in FIG. 3, one aspect of the present invention is the utilization of a plurality of smaller voltage power supply circuits 16 integrated throughout the chip to supply the current needs of individual functional circuit blocks. As shown in FIG. 3, each major functional electronic circuit element in a hearing aid, such as analog small signal amplifiers 18, main power amplifier 6, and digital electronic functions 20 can have their own individual integrated power supply circuit 16. This reduces the transient voltage changes and spike noise compared with driving all of the elements from a single, common power supply circuit 16.

Another aspect of the present invention involves redesigning certain high current circuit elements to be either bidirectional (polarity insensitive) or adjustable such that they can be directly driven by the battery. This reduces the series resistance between the battery and the load compared to a design approach in which high current elements are directly driven by a voltage polarity correction circuit.

Figure 4:
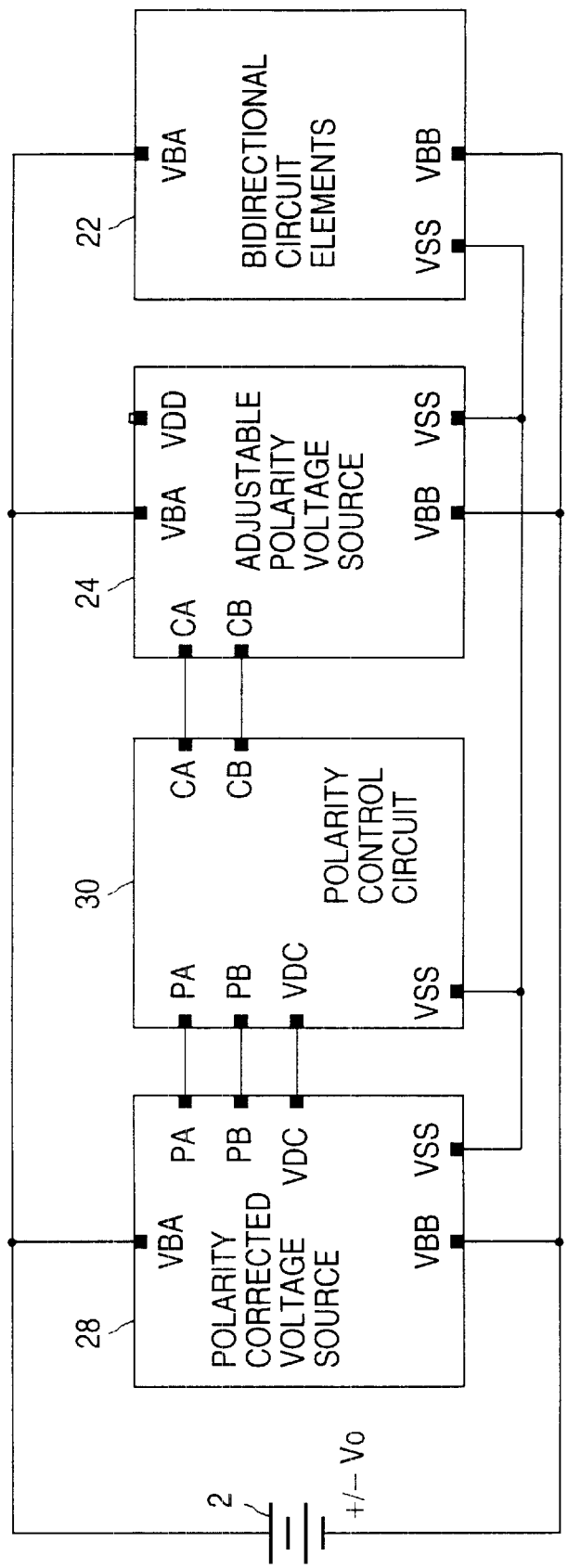
FIG. 4 is a functional circuit block diagram of an integrated circuit which has a combination of a polarity corrected voltage source, polarity control circuit, polarity adjustable voltage source, and bidirectional elements.

As shown in FIG. 4, in the present invention each functional element may comprise bidirectional (polarity insensitive) circuit elements 22, adjustable polarity voltage source elements 24, polarity control circuits 30, and a polarity corrected voltage source 28. Bidirectional circuit elements 22 are polarity insensitive in that they can be driven directly off of the battery 2 regardless of battery polarity. For example, polarity insensitive circuit elements 22 may comprise simple resistive loads or transistors with source-to-drain inversion capability. As shown in FIG. 4, a voltage polarity correction circuit 28 can be used to supply a polarity corrected voltage, $V_{DC}$, to other low-current circuit elements, such as a polarity control circuit 30.

One aspect of the inventive power management approach of FIG. 4 is that the polarity corrected voltage source 28 sets the substrate bias voltage $V_{SS}$, when the circuit is turned on. One barrier to directly operating a conventional CMOS circuit from a battery of variable polarity is that the substrate bias is typically tied to one battery connection such that the substrate bias also depends upon battery polarity. Since the threshold voltage of MOSFET transistors is a function of the polarity of the substrate bias, this makes it difficult to design efficient circuits, particularly when the available voltage is low. The power management design of FIG. 4 solves this problem by using a polarity corrected voltage source 28 to set the substrate bias.

Moreover, the inventors have recognized that a polarity corrected voltage source 28 can be used to assist other circuit elements sense and adjust to variable battery polarity in ways that are significantly more space and energy efficient than driving the entire circuit block off of a single polarity corrected voltage source 28. The inventors have recognized that the voltage polarity correction circuit 28 may provide voltage. reference signals PA and PB to polarity control circuit 30 which provide information on the actual battery polarity relative to the corrected battery polarity. For example, if PA corresponds to a polarity corrected "high" voltage and PB corresponds to a polarity corrected "low" voltage, then a comparison of PA and/or PB with the actual polarity of the battery may be used to "sense" the actual polarity of the battery in comparison with the desired polarity. Thus a voltage polarity correction circuit 28 can provide signals which may be used by other circuits to sense the actual battery polarity.

As shown in FIG. 4, voltage reference signals PA and PB are input to a polarity control circuit 30. In response, the polarity control circuit 30 provides output voltage control signals CA and CB. Output control signals CA and CB provide control information that assists other circuits to appropriately adapt for the actual battery polarity. Output voltage control signals CA and CB may be used in a variety of ways to alter the function of polarity adjustable voltage source 24. Control signals CA and CB may, for example, toggle distinct switch modes in polarity adjustable voltage source 24 appropriate for the actual battery polarity such that output voltage $V_{DD}$ retains a constant polarity regardless of battery polarity. However, control signals CA and CB could also be used to perform other functions, such as a voltage readjustment function (e.g., performing a gate bus voltage control function) to assist other circuit elements to adapt to variable battery polaritys).

There are many benefits to incorporating polarity adjustable voltage sources 24 in the manner shown in FIG. 4. One benefit is that a reduction in the size of the polarity correction function may be achieved. Previously known polarity corrected voltage source circuits typically utilize transistor designs that do not have as large a conductivity as is desired. In particular, conventional polarity correction circuits suitable for low-voltage applications typically utilize two p-type transistors and two n-type transistors arranged a bridge-type configuration. However, p-type transistors have a comparatively low conductance. Also, since the gate voltages are set at the battery voltage, the channel enhancement is poor. Consequently, extremely large transistors are needed to achieve a low series resistance.

The combination a polarity corrected voltage source 28, a polarity control circuit 30, and one or more polarity adjustable voltage sources 24 may be used to achieve an extremely space efficient polarity correction function. In particular, polarity adjustable voltage source 24 can be designed to utilize high conductivity transistors configured to achieve a correction function in a compact circuit with a low series resistance. Those of ordinary skilled in the art of integrated circuit design are familiar with high conductivity transistors. High conductivity transistors include, but are not limited to, n-channel MOSFET transistors. More recently, silicon-germanium transistors have demonstrated a high conductivity. The design approach of FIG. 4 permits a separation of functions. The polarity adjustable voltage sources 24 can have its circuit design selected to improve series resistance, whereas the polarity corrected voltage source 28 can be selected to provide a soft start-up response with a proper substrate bias.

The inventors have recognized that the use of a voltage polarity correction circuit 28 to set the substrate bias greatly simplifies the design of other circuit elements to be polarity insensitive with respect to the power supply connections made to the surface contacts of the integrated circuit (e.g., source drain inversion capability of drive transistors). This is a consequence of the fact that the threshold voltage of MOSFET transistors remains substantially constant once the substrate bias is fixed. As shown in FIG. 4, according to the teachings of the present invention it is desirable that a common ground reference $V_{SS}$ be established between all of the circuit elements to the chip substrate. As described below in more detail, once the polarity corrected voltage source 28 initially establishes a substrate bias it is also desirable that other circuit elements are connected to the substrate such that they subsequently reinforce this bias. This assists in maintaining a substantially constant polarity of the substrate bias during circuit operations. In particular, it is desirable that the polarity corrected voltage source is used to provide a soft start-up for the rest of the circuit elements and that the substrate bias is thereafter consistently reinforce to prevent potential body-steering problems, such as latch-up.

Those skilled in the art of semiconductor processing are presumed familiar with ways to make physical connections between an integrated voltage polarity correction circuit 28 and the substrate ground bias. One method is using a metal bridge, such as an aluminum metallization layer which acts as a shorting strap. Other circuit elements should be designed to operate consistent with the substrate ground bias established by the polarity corrected voltage source 28. Those skilled in the art of CMOS design are also presumed familiar with fabricating circuit elements consistent with a particular substrate bias to avoid silicon-controlled-recitifer (SCR) latchup.

Figure 5A:
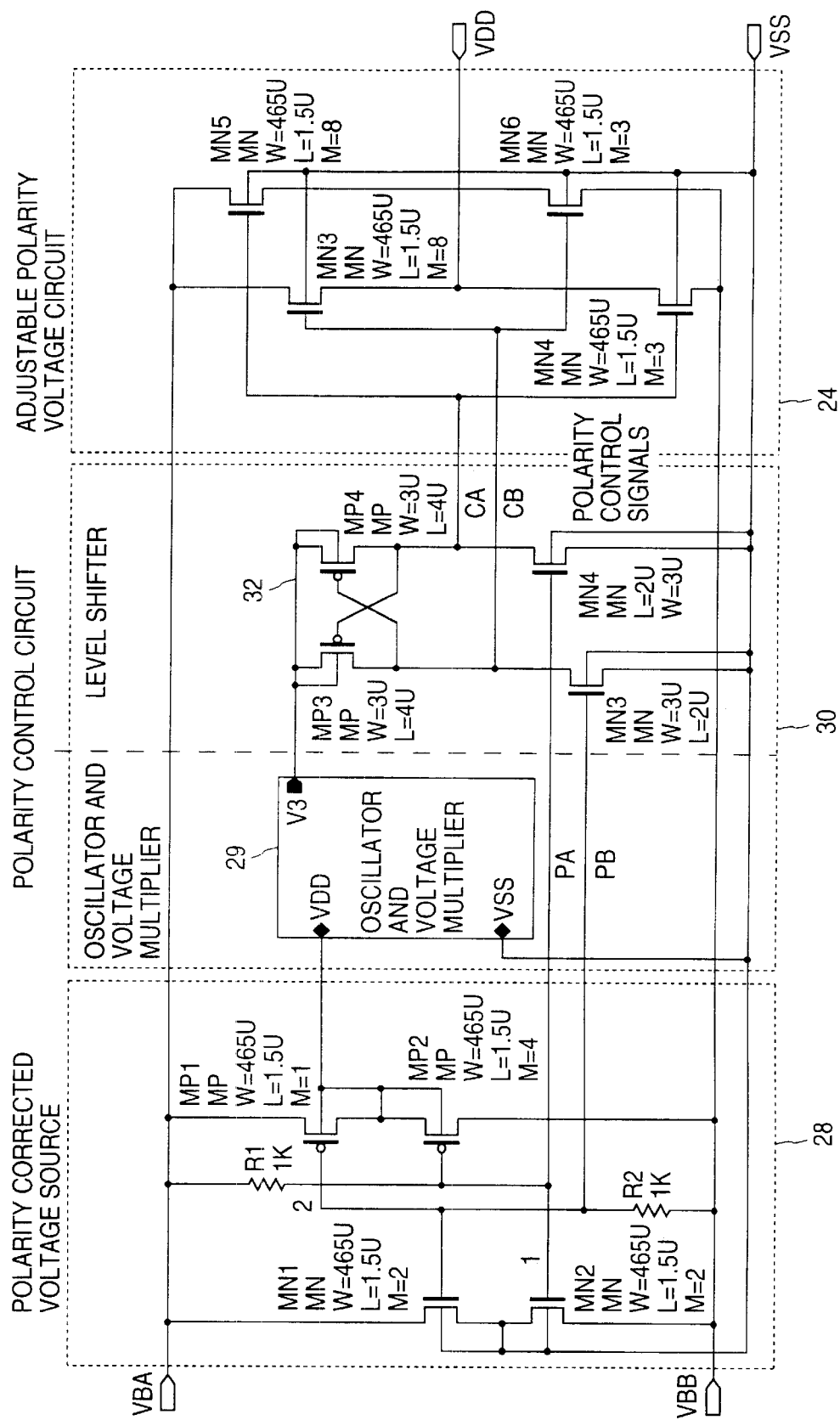
FIG. 5A is circuit schematic of an embodiment of a circuit containing a polarity corrected voltage source, a polarity control circuit, and a polarity adjustable voltage source.

Circuit embodiments of the polarity corrected voltage source 28, polarity control circuit 30, and polarity adjustable voltage source 24 are shown in FIG.'S 5A and 5B. FIG. 5A is schematic circuit diagram corresponding to a portion of the block diagram of FIG. 4. As shown in FIG. 5A, a polarity corrected voltage source 28 comprises a four transistor bridge circuit that converts input battery voltage inputs $V_{BA}$ and $V_{BB}$ of uncertain polarity into outputs $V_{DD}$ and $V_{SS}$ of constant polarity regardless of battery polarity. A variety of four transistor bridge circuits which operate on physical principles similar to the circuit shown in FIG. 5A are well known to those or ordinary skill in the art, such as that described in U.S. Pat. No. 4,423,456 "Battery Reversal Protection." Generally, the four switches of such bridge circuits are configured such that there are two current modes corresponding to the two battery polarities. The current paths in the bridge circuit are adjusted by the transistors such that the polarity on the load voltage remains constant.

However, according to the teachings of the present invention it is desirable that the polarity corrected voltage source 28 be comparatively compact. The bridge circuit of the polarity correction circuit 28 of the present invention is distinguishable in that it is designed as a low-current voltage source designed to supply peak currents one to two orders of magnitude lower than those of large signal amplifiers typically used in hearing aids. For example, a polarity correction circuit similar to that of U.S. Pat. No. 5,661,420 should be designed to provide about 10 mA of current if it used to supply the current needs of common large signal amplifiers used in hearing aids.

Consequently, its two n-channel transistors would have a width of about 41,000 microns and its two p-channel transistors have a width of about 110,000 microns. However, in the present invention, the polarity corrected voltage source 28 is designed to provide currents which are over 100 times smaller. For example, in the present invention the voltage polarity correction circuit 28 of FIG. 5A needs to only supply a current of about 50-to-100 $\mu$A to bias the substrate and power other small-current loads. Consequently, its transistors can have an extremely small width (e.g., several hundred microns) while still consuming relatively low amounts of power and producing an acceptable voltage drop (e.g., less than about 0.05 V).

The polarity correction circuit 28 of FIG. 5A has two n-channel and two p-channel MOSFET transistors having a gate length of 1.5 microns and a gate width, as indicated in FIG. 5A of less than about 2000 microns for the p-transistors and less than 1000 microns for the n-transistors such that it is extremely compact and is consistent with the processing of other transistor elements in the present invention. The circuit provides a polarity correction function similar to that of a full wave bridge rectifier. The voltage at the gate of transistors MN2 and MP2 is set by $V_{BA}$ whereas the voltage at the gate of transistor MN1 and MP1 is set by $V_{BB}$. However, transistors MN1 and MN2 are n-MOS transistors whereas transistors MP1 and MP2 are p-MOS transistors. Consequently, only two of the four transistors are on for a given battery polarity. For example if the battery polarity corresponds to $V_{BA}$ having a positive voltage with respect to $V_{BB}$, then transistors MN2 and MP1 will be on. Modeling MN2 and MP1 as perfect switches with no drain-source voltage drop, $V_{SS}=V_{BB}$ and $V_{DD}=V_{BA}$. Conversely, if the battery polarity corresponds to $V_{BA}$ having a negative voltage with respect to $V_{BB}$, then transistors MN1 and MP2 will be on. Modeling MN1 and MP2 as perfect switches, $V_{SS}=V_{BB}$ and $V_{DD}=V_{BA}$. Those of ordinary skill in the art are presumed familiar with analytical techniques to calculate the output voltages as a function of variable battery polarity including the resistance of all of the transistors. However, generally if the signals from the gates of the transistor pairs are taken as outputs one of them is always high and the other low with respect to the negative output voltage $V_{SS}$.

The polarity correction circuit 28 of FIG. 5A is a compact polarity corrected voltage source. There are several tradeoffs in its design. In particular, it is desirable that the polarity corrected voltage source be a part of a larger power management architecture approach. Referring to FIG. 4, the polarity corrected voltage source 28 preferably is capable of providing sufficient current to drive a polarity control circuit 30.

As shown in FIG. 5A, the polarity control circuit 30 may comprise an oscillator and static voltage multiplier 29 driven by the outputs of polarity corrected voltage source 28. The oscillator 29 may be used for other circuit functions, such as other digital or pulse forming functions. The general principles of oscillators, static voltage multipliers, and levels are well-known to those of ordinary skill in the art of CMOS design. The output of the oscillator and voltage multiplier 29 drive a level shifter circuit 32 used to provide control signals CA and CB to adjustable polarity voltage circuit 24 in response to battery inputs PA and PB. Control signals CA and CB are used in the adjustable polarity voltage circuit 24 to adjust the current paths of four n-channel transistors arranged in a double totem-pole configuration. The adjustable polarity voltage circuit 24 shown in FIG. 5A has many advantages. First, it utilizes only n-channel MOSFET transistors, which have about a factor of three higher conductivity compared with p-channel transistors. Also, since the polarity control circuit 30 may have a voltage multiplier 29 to increase the voltage of the control signals CA and CB substantially above the battery voltage, the n-channel transistors for the polarity adjustable voltage circuit 24 may be driven well into the ohmic region. Consequently, the adjustable polarity voltage circuit 24 may be relatively compact yet have a comparatively low series resistance. In particular, the size of the entire polarity correction circuit of FIG. 5A may be substantially smaller (e.g., at least a factor of four) than a single polarity corrected voltage source 28 dimensioned to provide the same equivalent electrical resistance. Thus, the power management circuit of FIG. 5A, if use by itself to power a hearing aid would permit at least a factor of four reduction in the size of the polarity correction circuit compared to conventional polarity correction circuits scaled to achieve a voltage source with a constant effective series resistance.

Figure 5B:
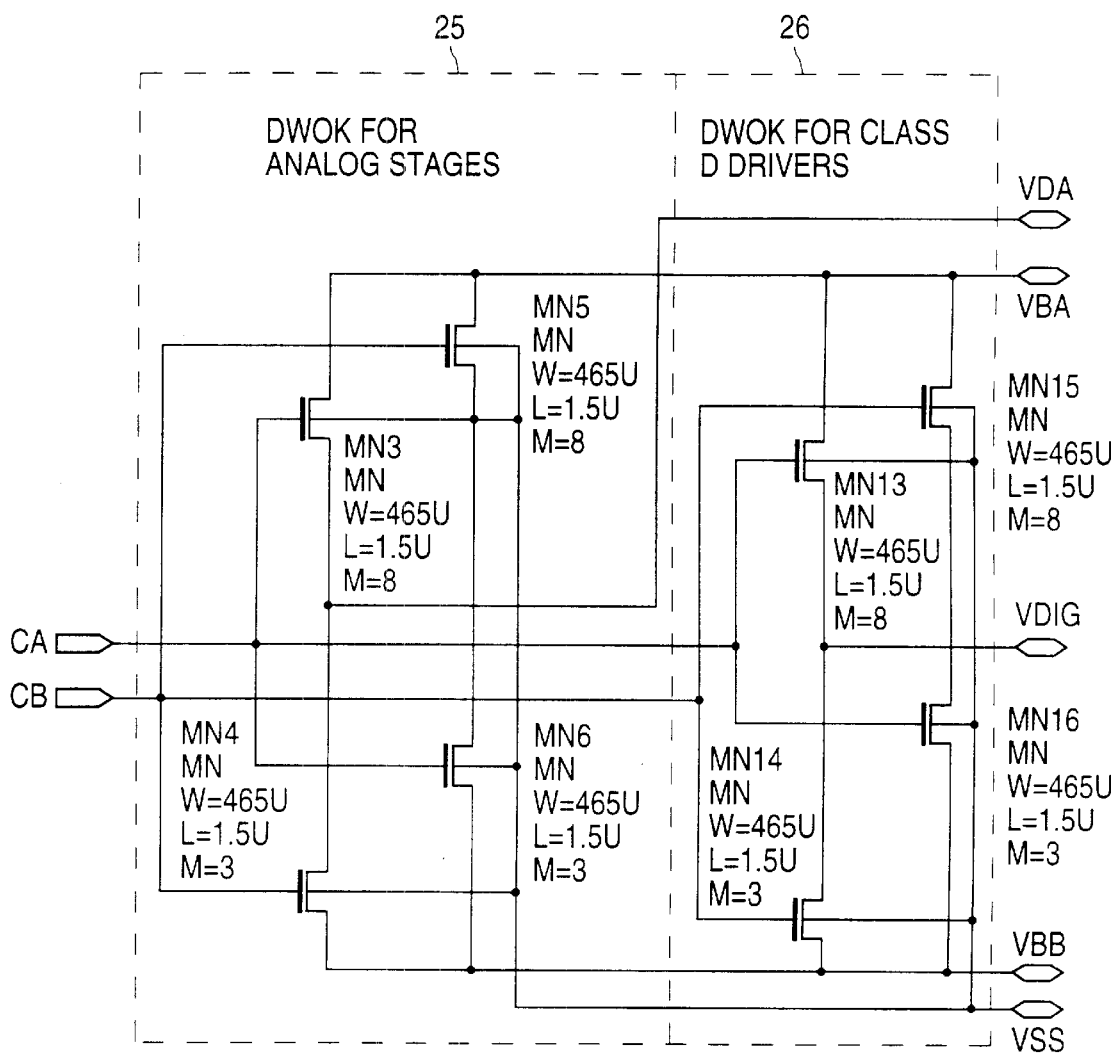
FIG. 5B is a circuit embodiment of an alternate embodiment of a polarity adjustable voltage source with tow independent voltage outputs.
Figure 5C:
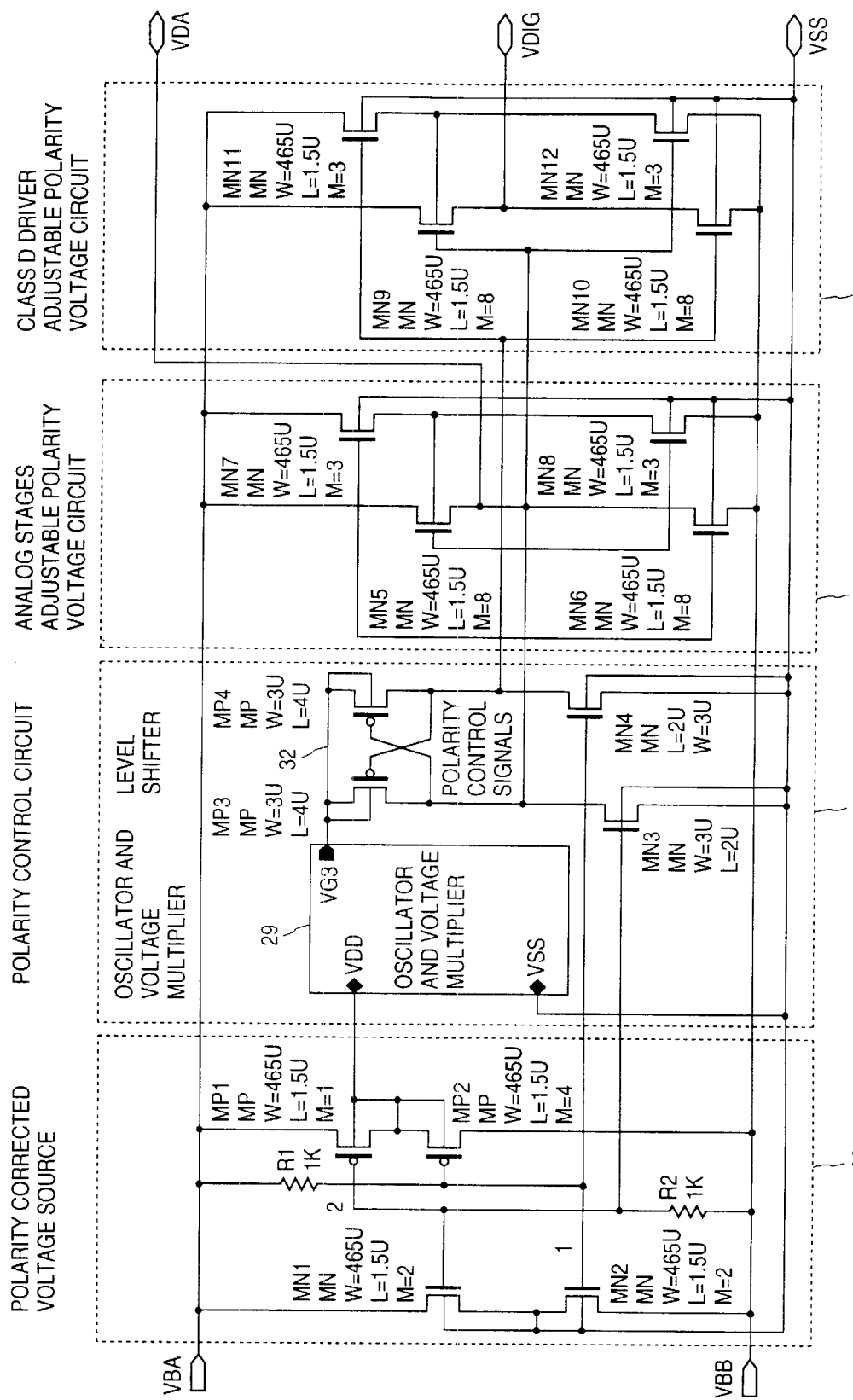
FIG. 5C shows the adjustable voltage source of FIG. 5B as part of a larger circuit containing a polarity corrected voltage source and polarity control circuit.
Figure 5D:
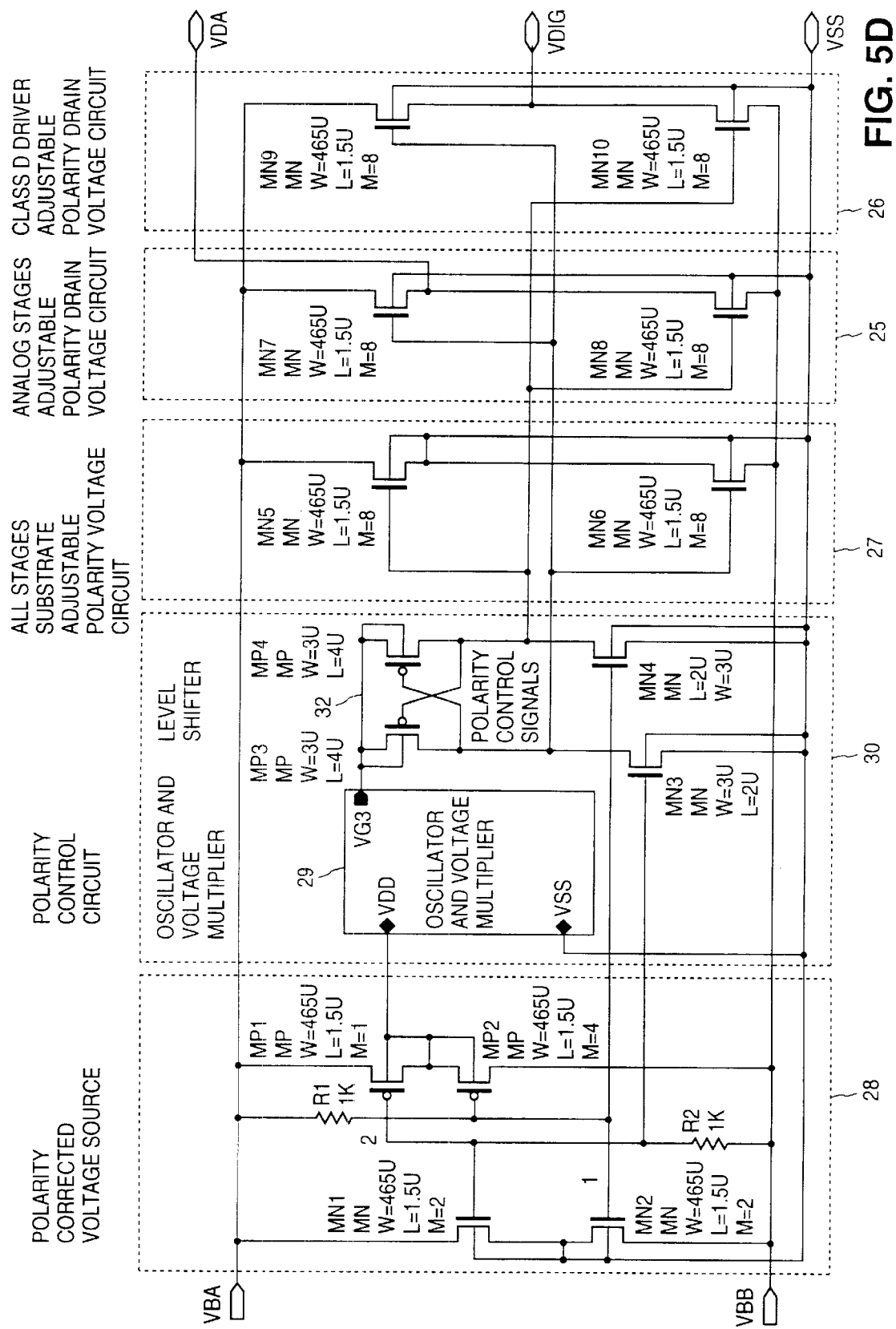
FIG. 5D is an another embodiment of the circuit of FIG. 5C containing an additional polarity adjustable voltage source to assist in maintaining the substrate bias.

The inventors have also recognized that the circuit of FIG. 5A may be further modified to provide substantially electrically isolated polarity corrected voltage sources for different electronic functions, such as small signal analog stages and driver circuits for Class D amplifiers. FIG. 5B is a circuit schematic of an polarity adustable voltage source with circuit elements similar to that of FIG. 5A. However, as shown in FIG. 5B, the polarity control circuit signals, CA and CB, are used to control two independent adjustable polarity adjustable voltage source circuits 25, 26 with two corresponding polarity corrected output voltages $V_{DA}$ and $V_{DIG}$. The first adjustable polarity correction circuit 25 is formed by transistors MN3, MN4, MN5, and MN6. The second adjustable polarity correction circuit 26 is formed by transistors MN13, MN14, MN15, MN16. FIG. 5C is a block circuit diagram of the polarity adjustable voltage source of FIG. 5B incorporated into a power management circuit including a polarity corrected voltage source 28 and polarity control circuit 30. FIG. 5D is another embodiment of the circuit of FIG. 5A. In this embodiment the polarity adjustable voltage source has two sections to provide separate voltage sources to analog amplifiers and Class D drivers. Additionally a third section 27 is used to further reinforce the ground bias $V_{SS}$.

The power management approach of FIG.'S 5B, 5C, and 5D thus permits at least a factor of four reduction in the size of a polarity correction circuit used to supply the current needs of a large signal amplifier while also greatly reducing spike noise problems. The circuit of FIG. 5B, 5C, and 5D performs the function of FIG. 3 in that it provides a space efficient means to provide a separate polarity corrected voltage source 24 to separate electronic block elements. This provides several important advantages, such as greater immunity to spike noise between different circuit elements. It is thus a practical means to realize the block circuit diagram of FIG. 4, thereby greatly increasing the performance of a miniature hearing aid or other electronics designed to be powered by a miniature battery of variable polarity.

Figure 6:
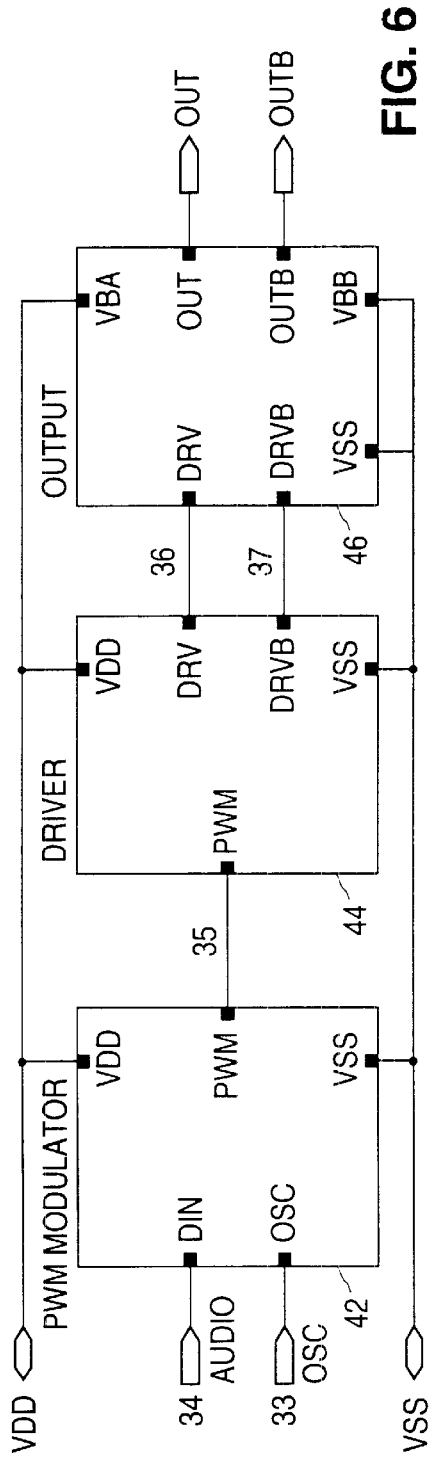
FIG. 6 is a block diagram of a Class D amplifier.

The power management architecture of the present invention is applicable to a variety of integrated circuits powered by a miniature battery of variable polarity. These include digital signal processing elements, linear amplifiers, oscillators, and clock circuits. However, the inventive power management architecture is particularly well-suited to be used in combination with an integrated amplifier comprising a Class D amplifier. As shown in FIG. 6, a Class D amplifier comprises a pulse width modulator 42, a driver circuit 44, and an output stage 46.

The amplifier has a pulse width modulator 42 that alters the pulse width of the oscillator pulses 33 as a function of the input audio signal 34; a driver circuit 44 to increase the voltage of the PWM signal 35 and to preferably produce two drive signals 36, 37; and an output stage 46 to provide power amplification of the drive signals 36, 37 corresponding to PWM signals 35. Oscillator and comparator circuits are well known to those skilled in the art. However, the oscillator which provides the oscillator signal 33 is preferably a low frequency noise oscillator, such as an RC oscillator with an isolated clock and with small voltage fluctuations. The comparator function in the pulse width modulator 42 may be accomplished with either one or two comparator sections, as in prior art Class D amplifiers. The pulse width modulator 42 converts the audio signal 34 from the small-signal amplifiers (not shown) to a PWM signal 35. The output of the pulse width modulator 42 is preferably a string of pulses whose width varies linearly with the strength of the audio input signal from a minimum of 10% to a maximum of 90% of the duty cycle. The driver circuit 44 of FIG. 6 could comprise a variety of conventional driver circuits. However, as described below in more detail, preferably the driver 44 also comprises a voltage multiplying function such that PWM signals from the comparator in pulse width modulator 42 are substantially increased in voltage before being fed into output stage 46.

Figure 7:
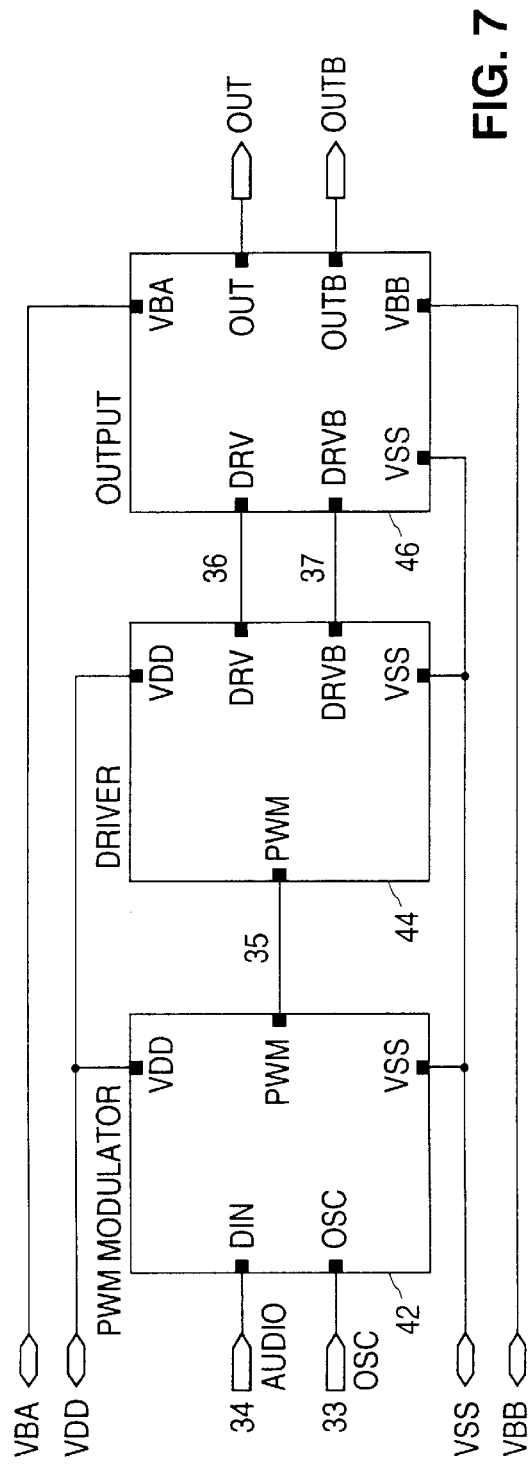
FIG. 7 is a block diagram of a preferred embodiment of a Class D amplifier in which the power transistor of the output stage are directly powered by the battery.
Figure 8:
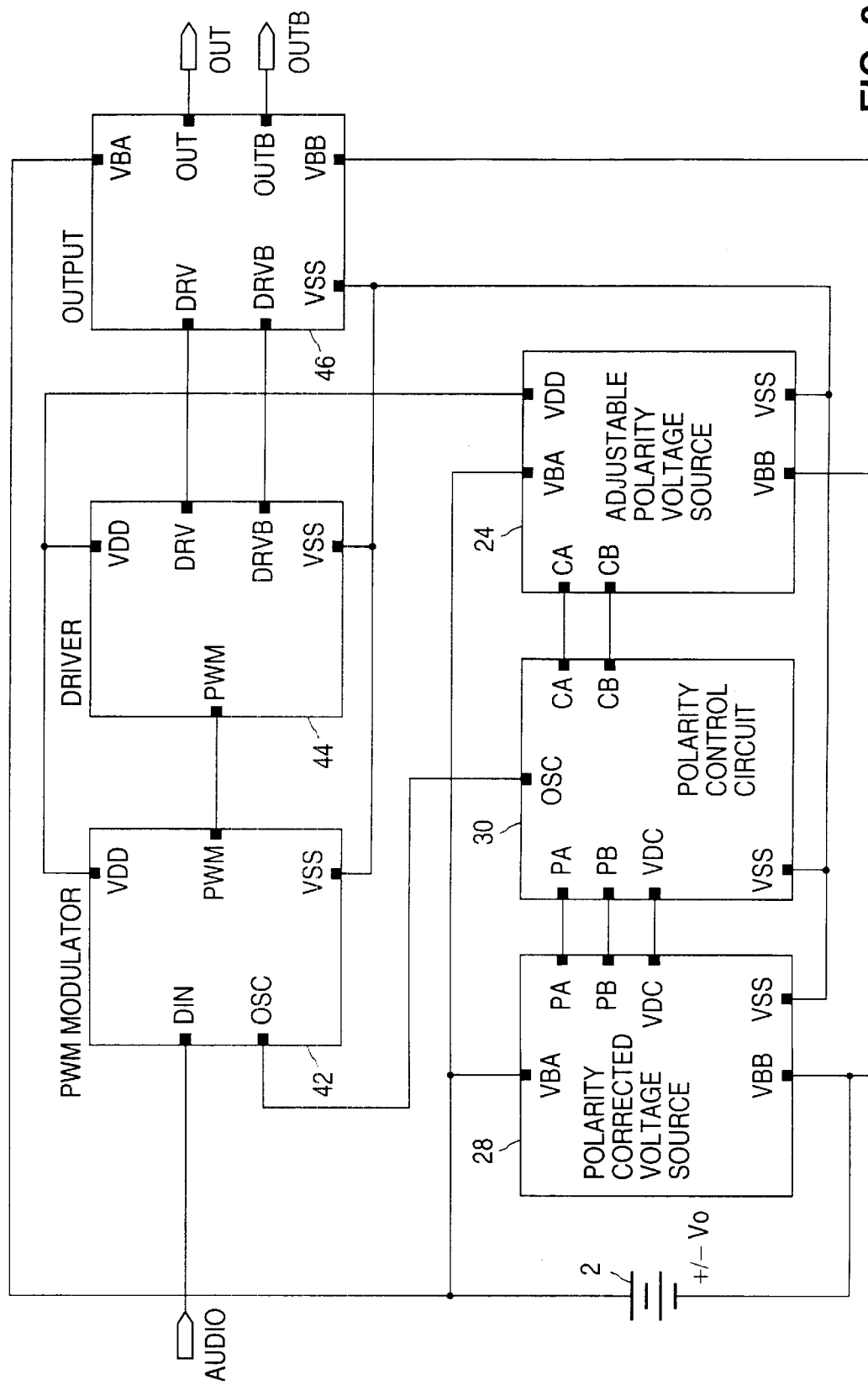
FIG. 8 shows the block diagram of FIG. 7 as part of a larger circuit with additional polarity adjusted voltage source to provide the power requirements of the pulse width modulator and driver circuits.

As shown in FIG. 6, the conventional approach to supplying the power needs of all of the functional elements of a Class D hearing aid is to connect all of the blocks in parallel to a common power source. For the case of a Class D amplifier powered by a miniature battery of variable polarity, the approach of FIG. 6 would require that all of the circuit blocks be powered by a battery polarity correction circuit. The inventive constant polarity voltage source of FIG. 5A, 5B, 5C, and 5D could be used to drive a conventional Class D amplifier. However, the inventors have recognized that in hearing aids the H-bridge output stage of the Class D amplifier consumes up to 90% of the current. A significant reduction in circuit size can be achieved by redesigning the H-bridge output stage to be polarity insensitive so that it can be directly powered by the battery. As shown in FIG. 7, the pulse width modulator 42 and driver 44 may have polarity corrected voltage inputs $V_{DD}$ and $V_{SS}$. As shown in FIG. 8, polarity corrected voltage inputs $V_{DD}$ and $V_{SS}$ preferably are produced from a polarity corrected voltage source 28, polarity control circuit 30, and polarity adjustable voltage source 24. However, as shown in FIG. 7 and 8, high current elements (not shown) in output stage 46 may be directly tied to battery inputs $V_{BA}$ and $V_{BB}$.

As shown in FIG.'S 7 and 8, output stage 46 is preferably designed such that its main power transistors have source drain inversion capability so that the output stage 46 of the amplifier circuit operates properly regardless of battery polarity. As previously discussed, the polarity corrected voltage source 28 is used to initially establish the substrate bias for the entire circuit, which facilitates designing output stage 46 to be polarity insensitive (i.e., transistor drain-to-source inversion capability) with respect to the polarity of battery connections made to internal switching transistors.

In a preferred from of the present invention, the output stage 146 comprises four n-channel transistors arranged in an H-bridge configuration for Class D power amplification. This is shown in the output stage 146 of FIG.'S 9 and 10, which show two different embodiments of output stage 46 with voltage multiplying driver circuits 72. The output stage 146 comprises four n-channel transistors 50-A, 50-B, 50-C, and 50-D configured into two totem-pole structures. The gates of the two totem-pole transistor structures are cross-coupled such as to create the two inputs of the H-bridge and the source-drain contact are cross-coupled to create the two output terminals of the H-bridge. When signal 80 is high and signal 78 is low, transistors 50-C and 50-D are turned on while transistors 50-A and 50-B are turned off. Consequently, output signal OUT1 will be high and OUT2 will be low. Conversely, if signal 78 is high and 80 is low, transistors 50-A and 50-B will be turned on while transistors 50-C and 50-D will be turned off. The all p-channel H-bridge output stage 146 of FIG.'S 9 and 10 permits rail-to-rail amplification of a PWM input signal fed through the driver circuit 44.

An n-channel Class D amplifier output stage 46 has different gate drive voltage requirements than conventional complimentary pair Class D amplifiers. Conventional complimentary pair Class D amplifiers will function with comparatively low gate voltages. The driver does not have to provide substantial voltage multiplication in order for a complimentary pair H-bridge amplifier to be driven by a miniature battery. However, as is well known in the art of CMOS circuit design, an n-channel enhancement mode MOSFET transistor is driven to the ohmic region (high conductivity) when the gate voltage exceeds the threshold voltage. In the all n-channel structure, the transistors operate in a return-to-zero mode in which the gate bias alternates between a low and high value. However, if the voltage swing is not high enough, the transistors will not fully turn-on (e.g., fully enter the ohmic region). The desired gate-source voltage may be estimated from well-known MOSFET equations. In order for a single n-channel transistor to be driven into the ohmic regime, the gate source voltage should be at least as high as $V_T+kV_{BS}$, where k is a constant related to the substrate bias effect. It is thus preferable that the gate-source voltage be increased to at least twice the threshold voltage in order to be able to drive each n-channel transistor into the ohmic regime.

In a preferred embodiment of an all n-channel H-bridge output stage, the high side n-channel MOSFET transistor that its drain connected to the positive rail and its source connected to the output (e.g., transistor 50-A and 50-C) is preferably driven to a voltage of about 1.7 to 2.2 V to operate like a true switch (e.g., driven well into the ohmic region). It is thus preferable that the driver circuit be capable of at least doubling the voltage of a miniature battery. The rise time and fall of pulse signals 78, 80 is preferably less than 10% of the minimum pulse width and the maximum voltage variation is preferably less than 10% over all.

Figure 9:
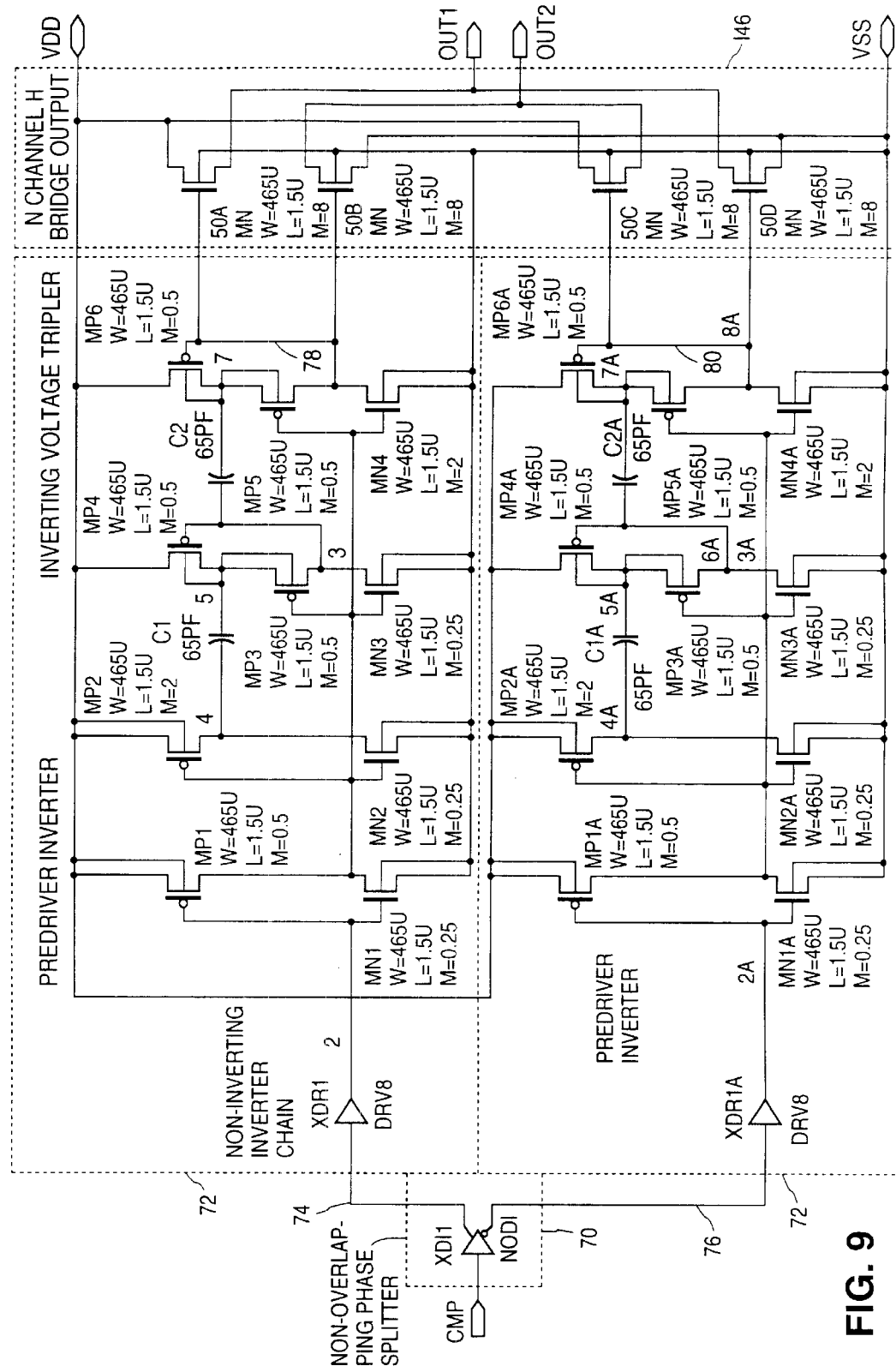
FIG. 9 is a schematic circuit diagram of an embodiment of a Class D amplifier with voltage multiplying drive circuits and an n-channel H-bridge output stage.
Figure 10:
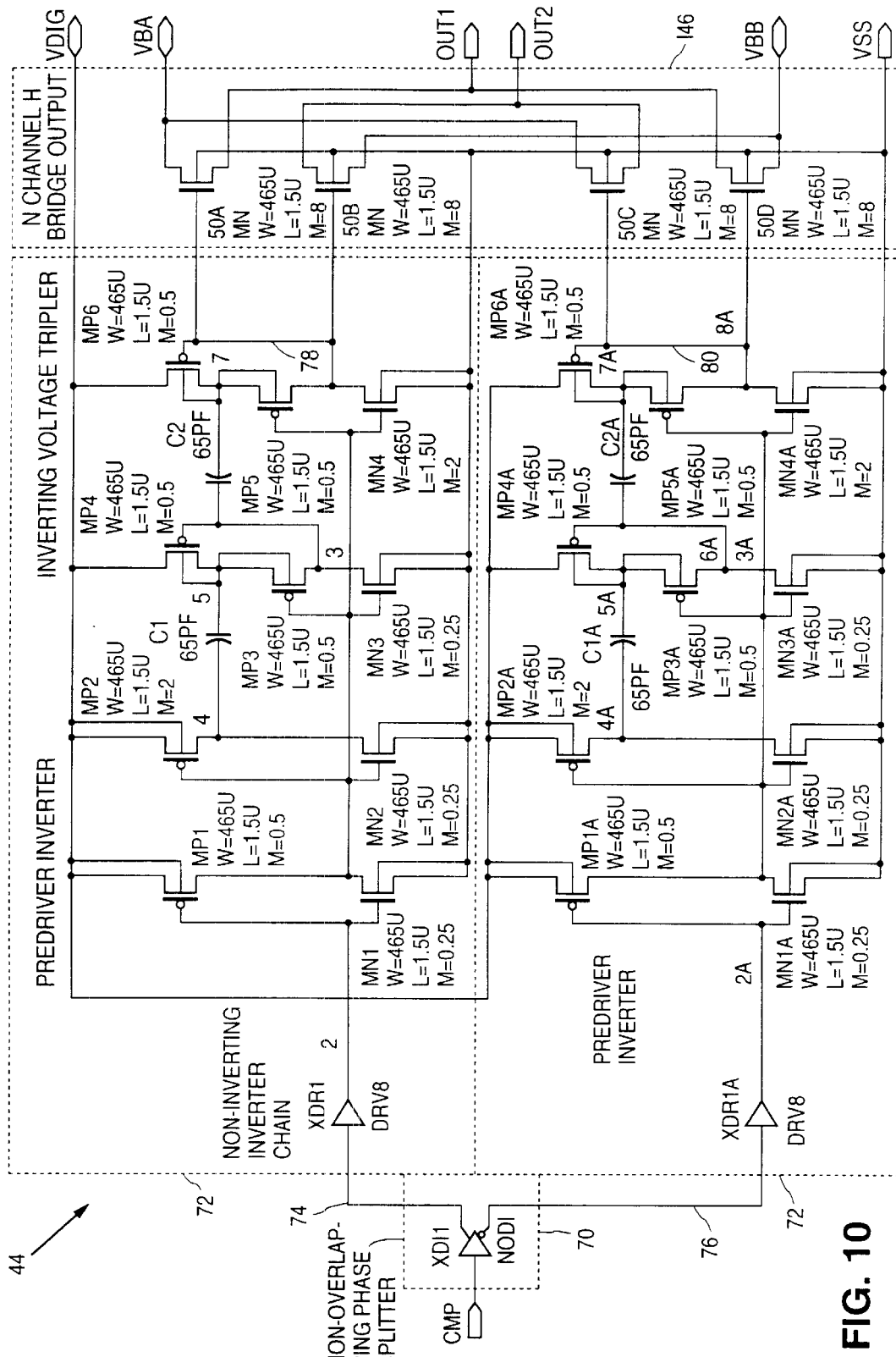
FIG. 10 is a schematic circuit diagram of a preferred embodiment of a Class D amplifier with voltage multiplying drive circuits and an n-channel H-bridge output stage.

The all n-channel H-bridge output stage 146 of FIGS. 9 and 10 provides the benefit of potentially smaller size compared to a conventional H-bridge output stage. Typically, p-channel transistors have to be made substantially larger, by a factor of two-to-three, to have the same conductance as an n-channel transistor. However, the inventors believe that to fully exploit the potential benefits of an all n-channel transistor H-bridge amplifier the driver circuit 44 required to operate an n-channel H-bridge amplifier should be compact and capable of providing substantial voltage multiplication. Preferably, the voltage multipliers double or triple to the gates. A high gate drive voltage (i.e., one substantially above the threshold voltage) is required to drive a transistor into the ohmic region.

A variety of conventional charge pump circuits are capable of increasing the voltage of drive signals substantially beyond 1.7 Volts. It is well known that a variety of circuits may be used that incorporate a plurality of capacitors to increase the effective voltage of pulses in a circuit. Typically, such circuits periodically charge one or more capacitors which are used to increase the current and/or voltage of input signals. However, many conventional charge pump circuits require relatively large capacitors in order to store enough charge to drive the gates of common H-bridge circuits. Also, many conventional charge pump circuits utilize capacitors which are leaky and/or which have a large plastic parasitic capacitance. In some cases, the leakage and parasitic capacitance make it difficult to efficiently utilize several capacitors to substantially increase the voltage from a low voltage source. Typically, the total size of a conventional charge pump is comparatively large, particularly if the capacitors of the charge pump are of sufficient size to provide enough charge to rapidly adjust the voltage to a transistor having a comparatively large gate capacitance.

In a preferred embodiment of the present invention, the driver utilizes charge pump capacitors that are extremely compact. A variety of modern materials structures may be used to achieve a compact capacitor. As is well known, the capacitance of a parallel plate capacitance is proportional to the dielectric constant divided by the effective plate separation. One way to increase the capacitance of charge pump capacitors is to utilize dielectric materials with a high dielectric constant. A variety of dielectric materials with a high dielectric constant are well known to those of ordinary skill in the art of semiconductor device fabrication. However, in many cases utilizing an extremely high dielectric constant material to fabricate a compact charge pump capacitor is inconsistent with a high yield CMOS fabrication process.

In a preferred embodiment of the present invention the capacitance per unit area of the charge pump capacitors is increased by a factor of four compared to typical charge pumps by using capacitors comprising an ultra-thin oxide materials structure similar to that used in erasable electrically programmable read only memory (EEPROM) as part of a programmable memory element. Ultra-thin oxides, commonly known as tunnel oxides, are well known to those of ordinary skill in the art of CMOS design. Tunnel oxides are typically less than 200 Angstroms in thickness such that electron tunneling occurs at a comparatively low voltage. However, such ultra-thin oxide structures are not used to fabricate large area capacitors. One reason such tunnel oxide structures are not used as large area capacitors is because electron tunneling occurs at a comparatively low voltage, particularly when the oxide layers are reduced to less than about one hundred Angstroms such that the effective capacitance per unit area is high. Consequently, a capacitor comprised of a tunnel oxide layer structure would be extremely leaky if it was operated at common CMOS circuit voltages. Another reason why tunnel oxide structures are not used as large area capacitors is that there have been technical barriers to achieving a reproducible ultra-thin oxide structure over a large area. Until comparatively recently it was impossible to fabricate large area capacitors using ultra-thin oxides because the defect density was too high. Large area structures incorporating ultra-thin had dead shorts. However, defect densities have decreased dramatically in recent times so that large area capacitors can be grown using ultra-thin oxides without shorts caused by defects. Experiments by the inventors on capacitors fabricated as test structures have led them to conclude that recent advances in technology permit large area capacitor structures utilizing ultra-thin oxides to be fabricated without electrical shorts and with substantially conformal oxide layers.

The inventors have recognized that for low-voltage CMOS applications a capacitor incorporating a tunnel oxide layer may be used to fabricate capacitors with a high capacitance per unit area as long as the voltage across each capacitive element is kept low enough to prevent the onset of electron tunneling. Also, the inventors have recognized that recent advances in technology permit comparatively large area capacitor structures to be fabricated with substantially conformal oxide layers and with a high fabrication yield. Thus, sandwich layer structures comprised of one or more thin oxide layers sandwiched between conductive layers (e.g., polysilicon) may be used to fabricate large area capacitors. Since one or more of the oxide layers can be extremely thin (e.g., less than about two hundred Angstroms and preferably less than about one hundred angstroms) the capacitance per unit area can be extremely large. Separate electrical contacts to each conductive layer in the sandwich structure can be made using processing steps similar to those of EEPROM devices.

Figure 11:
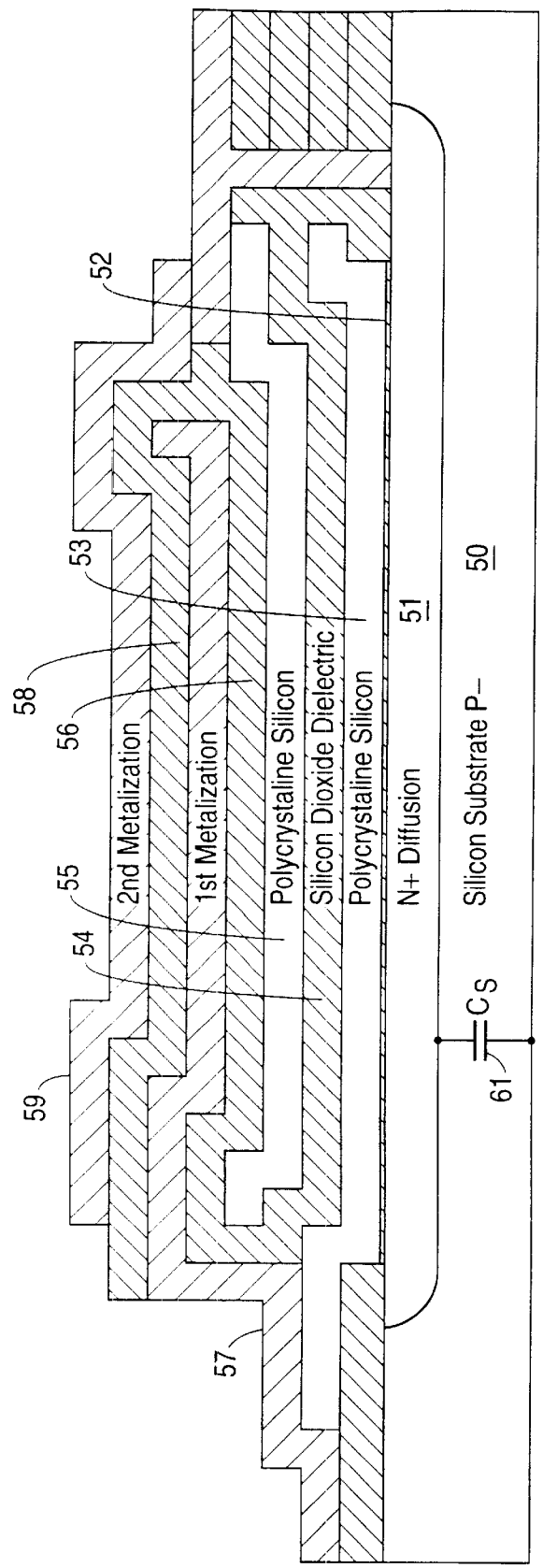
FIG. 11 is a side view of the inventive capacitor structure.

The inventors have designed a capacitor structure incorporating a tunnel oxide layer with an especially high capacitance per unit area which can hold a voltage greater than about four volts. It is difficult to grow conformal ultra-thin oxides directly on top of polysilicon layers or metal layers. Consequently, the inventors believe that the thinnest oxide layers should preferably be grown directly on top of a silicon substrate. As shown in FIG. 11, the preferred capacitive structure comprises: 1) a p-substrate 50; 2) an N+buried layer 51; 3) a tunnel oxide silicon oxide layer 52 less than about one-hundred Angstroms in thickness and preferably eighty Angstroms in thickness; 4) a first polysilicon layer 53 of about three-hundred Angstroms in thickness; a second silicon dioxide layer 54 of about three-hundred Angstroms in thickness; a second polysilicon layer 55; a third silicon dioxide layer 56 several hundred Angstroms in thickness; a first metallization layer 57; a fourth silicon dioxide layer 58 several hundred Angstroms in thickness; and a second metallization layer 59. As shown in FIG. 11, the first metallization layer 57 contacts the first polysilicon layer 53 whereas the second metalization layer 59 contacts the n+layer 51 and the second polysilicon layer 55. The capacitor structure of FIG. 11 functions as a series of interleaved capacitors.

The inventors have determined that this tunnel oxide capacitor structure has extremely low leakage currents as long as the total voltage on the capacitor remains low enough that the tunneling regime in the ultra-thin oxide layer 52 is avoided. However, since the miniature battery voltage is, depending upon how fresh the battery is, at least a factor of two-to-three below the tunneling voltage, this may be achieved by designing a charge pump such that the voltage across each capacitor does not exceed the battery voltage. The total capacitance can approach 4 femto-Farads per square micron of capacitor area. This is in large part due to the thin oxide layer 52, which accounts for about 3 femto-Farads per square micron of capacitor area. However, other oxide layers 54, 56 in the sandwich structure also contribute to the total capacitance, although since they use substantially thicker oxide layers to facilitate conformal growth (e.g., greater than about three-hundred Angstroms), their individual contribution to the total capacitance is substantially smaller.

The inventive capacitor also has a low parasitic capacitance, which is particularly important to achieve substantial voltage multiplication utilizing a plurality of capacitors. There is a parasitic capacitance in the inventive capacitor associated with the capacitance between the N+layer and the p-substrate. However, the inventors have recognized that the equivalent varactor structure has an extremely low parasitic capacitance as long as the substrate bias potential $V_{SS}$ and N+region 51 contact metal bias is maintained such that the equivalent varactor capacitance 61 to substrate 50 is that of a reverse biased diode with a comparatively large effective capacitor plate separation. The inventive capacitor structure of FIG. 11 has an extremely low parasitic capacitance 61, $C_S$, with respect to the substrate 50 of about 0.08 femto-Farads per square micron of capacitor area. The above-described properties of this capacitor structure make it especially suitable for use in a compact voltage multiplier to double or triple the effective voltage of a nominal 1.1 Volt battery.

The preferred inventive capacitance sandwich structure has wide applicability in charge pump circuits designed to increase the effective voltage of a low voltage battery. The general principles of charge pump voltage multiplier circuits are well-known to those of ordinary skill in the art. Typically, one or more capacitors are periodically charged by the supply voltage. Additional switches permit a voltage to be taken in series from one or more capacitors, sometimes also in series with the supply voltage. However, typical CMOS charge pump circuits use integrated capacitors with a comparatively low capacitance per unit area and with a comparatively large parasitic capacitance per unit area. The inventors have recognized that a tunnel oxide capacitor structure permits substantial improvements in voltage multiplier circuit performance. The total size of the voltage multiplier may be reduced because the size of the capacitors may be decreased. Also, the low parasitic capacitance and the low leakage current of the tunnel oxide capacitor structure at low voltages improves the efficiency of a voltage multiplier. However, there are some design tradeoffs. In particular, a voltage multiplier circuit using an EEPROM oxide structure should be designed so that the voltage across the tunnel oxide layer 52 of each capacitor structure is kept low enough to prevent significant electron tunneling. Additionally, to keep the parasitic varactor capacitance low, a proper polarity of the substrate 50 bias relative to the N+ layer 51 should be maintained. Moreover, it is desirable that charge pump capacitors are connected to node voltages so that the parasitic varactor capacitance is kept low (i.e., the parasitic varactor diode of the capacitor is strongly reversed biased). Additionally, it is desirable that the doping profile of the varactor diode be selected to reduce the varactor capacitance. The physical principles of controlling doping diffusion/implantation profiles to alter the characteristics of a varactor diode are well known to those of ordinary skill in the art of semiconductor fabrication. Generally, the N+layer 51 may comprise an n-type surface region (commonly known as an n-well) with a doping profile that is a function of distance from the surface. In particular, it is desirable that the doping profile of the N+layer 51 be selected to form a $n^+/n^-/p^-$ varactor diode with the p-substrate, since this further reduces the parasitic capacitance.

Figure 12A:
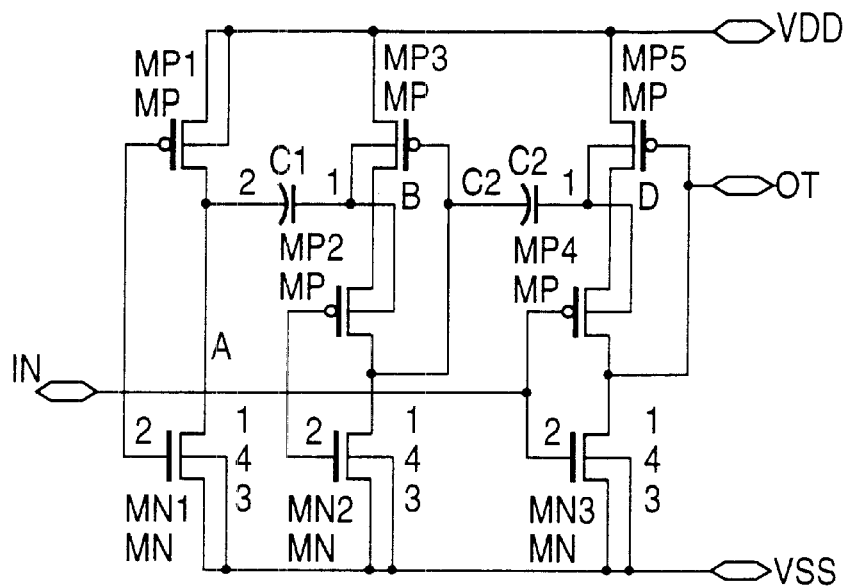
FIG. 12A is a circuit schematic of a voltage multiplier designed to utilize the inventive capacitor structure to achieve efficient voltage multiplication.

An efficient transient voltage multiplier charge pump circuit designed by the inventors and incorporating such a capacitive structure is shown in FIG. 12A. The circuit utilizes 3 n-channel MOSFET transistors, 5 p-channel MOSFET transistors, and two capacitors. Referring to FIG. 12A, when the three n-channel transistors are driven with a positive gate voltage, transistors MN1, MN2, MN3, MP3 and MP5 are on and transistors MP1, MP2, and MP3 are off. The capacitors then charge to the supply voltage, which is substantially less than the electron tunneling voltage. Conversely, when the three n-channel transistors have a low gate input, the capacitors are connected in series above the positive supply line, resulting in a voltage which is about three times the supply voltage. The circuit of FIG. 12A results is a transient voltage multiplier which greatly increases the voltage of PWM pulses. The circuit is especially designed for use with the preferred capacitor structure, which are used to fabricate capacitors $C_1$ and $C_2$. Referring to FIG. 12A, capacitors $C_1$ and $C_2$ are disposed in the circuit such that the preferred capacitor structure is: 1) not biased above the polarity corrected voltage $V_{DD}$ (which is substantially below the tunnel voltage of about five volts) and 2) the capacitors are connected so that the parasitic varactor diode capacitance is minimized. The difference in node voltage between node 2 and node 1 of capacitors C1 and C2 is always non-zero and positive, which maintains the parasitic varactor capacitance 61 in a reverse biased mode. Also, the capacitor is connected to the node voltages of the circuit so that the varactor is as reversed biased as much as possible given the limited voltage available.

Figure 12B:
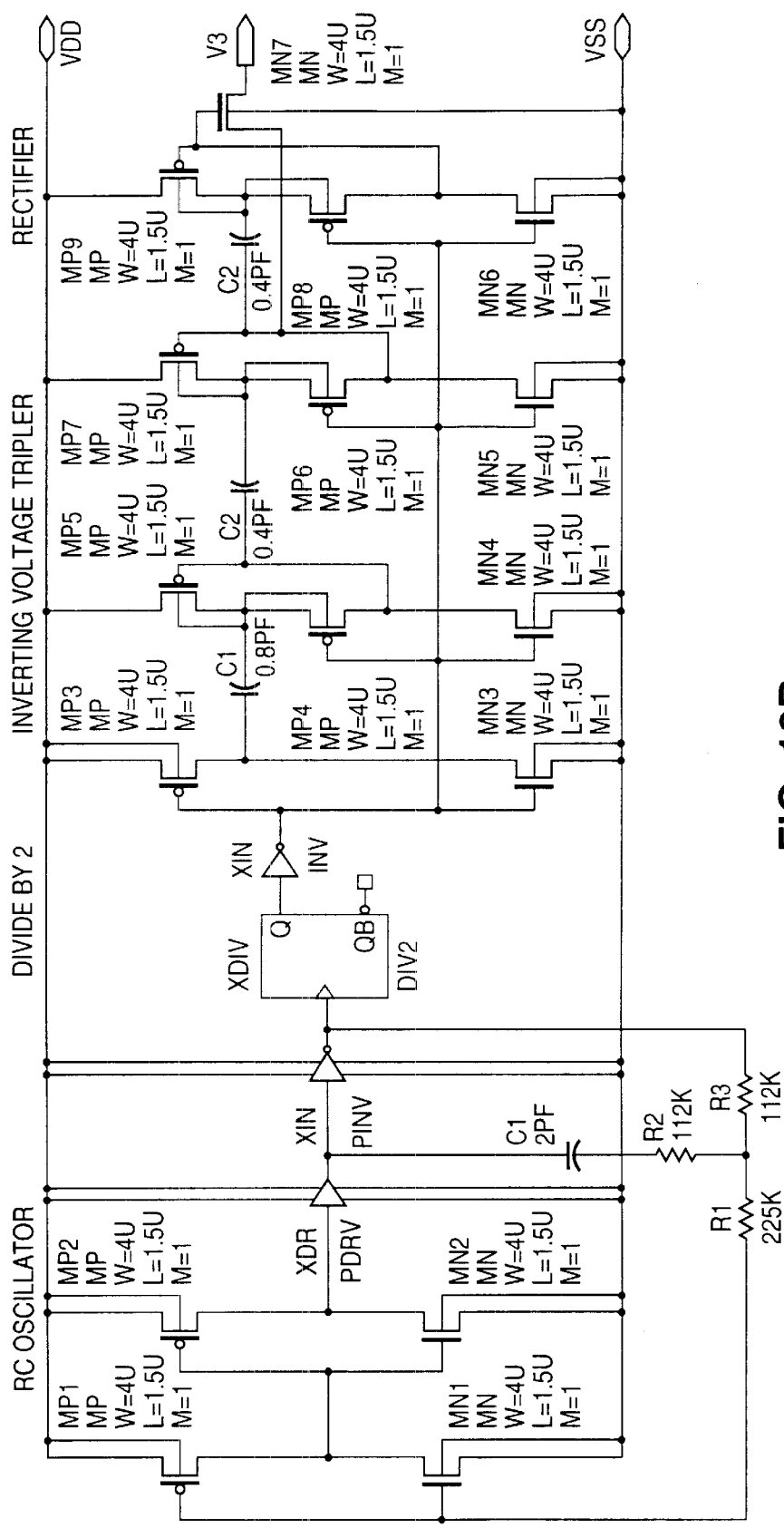
FIG. 12B is a circuit schematic of the voltage multiplier of FIG. 12A as part of a larger charge pump circuit including oscillator and rectifier elements.

Voltage multiplier circuits also typically utilize an RC oscillator circuit and sometimes rectifier circuits. FIG. 12B is the voltage multiplier of FIG. 12A with an additional conventional RC oscillator circuit with additional rectifier elements. Generally, the voltage multiplier of FIG. 12A may be combined with other well-known charge pump circuit elements to perform a transient voltage pulse multiplication function.

There are several advantages to the voltage multiplier of FIG. 12A. The use of a tunnel oxide capacitor structure permits a substantial reduction in the size of the associated capacitors, resulting in a reduction in the associated size of the voltage multiplier. The low parasitic capacitance of the tunnel oxide capacitors reduces parasitic losses. Generally, the voltage multiplier of FIG. 12A may be extended to include additional charge pump stages, since each individual EEPROM capacitor is kept below a voltage where electron tunneling is a significant effect. Experiments by the inventors indicate that a plurality of voltage multipliers circuits similar to that of FIG. 12A may be chained together in series to produce pulses with an output voltage substantially in excess of 12.5 volts such that the inventive charge pump may have other applications, such as programming EEPROM memory cells. By way of comparison, other experiments by the inventors using conventional "floating" poly-poly capacitor structures are only able to achieve a maximum voltage multiplication of about seven volts. The inventors believe that the inventive voltage multiplier enables substantial voltage multiplication to be achieved in an extremely compact, efficient circuit because the circuit effectively exploits the low parasitic capacitance of the inventive capacitor.

As shown in FIG. 10, the driver 44 preferably comprises two voltage multipliers 72 similar to that of FIG. 12A. The PWM signal from the comparator stage is amplified and split into two signals, a normal 74 and an inverted 76 version of the PWM signal. The split signals are further amplified and inverted in a predriver inverter before being voltage boosted in separate transient voltage multipliers. The outputs from the drive circuitry of FIG. 10 thus include a voltage multiplied replica 78 of the PWM signal and a voltage multiplied inverted replica 80 of the PWM signal used to drive the n-channel transistors 50-A, 50-B, 50-C, and 50-D of output stage 146.

The inventors have also realized that the efficiency of an H-bridge amplifier driven off of a low voltage battery can be substantially improved by proper shaping of the pulses entering the H-bridge transistors. As previously discussed, conventional H-bridge amplifiers are designed to convert a PWM signal into a rail-to-rail voltage multiplied replica of the original PWM signal. Commonly, H-bridge amplifiers are modeled as being comprised of perfect switches having two current modalities. However, the inventors have realized that on H-bridge amplifier supplied by a low voltage battery is more closely modeled as being comprised of weakly conducting switches. In common H-bridge designs using n-channel and p-channel transistors there is a parasitic transient switching current due to the fact that the transistor switches do not instantly turn on and off. During a portion of the switching cycle, two sets of transistors are on for some portion of the pulse cycle. This creates a parasitic current, which the inventors describe as a "crowbar" current. This crowbar reduces the efficiency of a H-bridge amplifier.

The inventors have recognized that crowbar currents are an especially severe problem in a low-voltage H-bridge amplifiers suitable for hearing aids powered by low-voltage batteries. One reason is that the rise time of pulses is typically about 10–100 times slower for low voltage CMOS circuits compared to conventional CMOS circuits. The slow rise time is a consequence of higher gate capacitances at low voltage and the generally reduced currents which are available to charge capacitive elements. The slow rise time, in turn results in low voltage CMOS circuits operating in a crowbar mode for a comparatively large fraction of a clock or oscillator cycle time. Also, in low voltage H-bridge amplifier applications, crowbar currents occur during every switching cycle, further increasing the relative magnitude of crowbar currents compared to applications, such as digital logic circuits, where there is only a limited statistical probability that all inputs will be enabled so that they are on from some overlapping portions of a clock cycle.

Crowbar currents waste precious power and energy. However, the inventors have recognized that crowbar currents are especially undesirable in H-bridge amplifier applications because of associated noise problems. The parasitic crowbar currents tend to increase the noise level in the hearing aid. As is well known, a parasitic current may add various forms of statistical noise to an amplifier. Additionally, in the case of an H-bridge amplifier, parasitic currents increase the total current demands of the amplifier. Consequently, comparatively large filter capacitors may be required to filter the H-bridge amplifier from other circuit elements, such as low-noise pre-amplifier circuits.

The inventors have realized that their all n-channel H-bridge amplifier output stage design can be further modified to reduce parasitic crowbar currents. The efficiency of an all n-channel H-bridge amplifier can be improved by using what the inventors describe as a "pulse trimming" (break-before-make switching) mode of operation. Pulse trimming requires a circuit that appropriately adjusts the rise and fall times of signal pulses to the output stage to reduce and/or eliminate crowbar currents. Although pulse trimming could also be used with a conventional Class D amplifier, the inventive n-channel H-bridge amplifier permits a comparatively simple embodiment of a pulse trimming circuit. Conventional Class D amplifiers would require a comparatively complex circuit to fully achieve the benefits of pulse trimming. In particular, conventional Class D amplifiers using both n-type and p-type MOSFETS would require a pulse trimming driver circuit which performed a complex voltage adjustment function to both trim the pulses and to adjust the signal appropriately for the two different types of transistors. The inventors have recognized the all n-channel transistor H-bridge permits a comparatively simple pulse trimming circuit 70 to be utilized to achieve in-phase and phase-inverted pulses which are pulse trimmed with respect to each other. The inventive n-channel H-bridge transistor output stage has a return to zero response. It utilizes a first set of amplified (in-phase) pulses and a second set of (phase-inverted) pulses to drive its gates. The phase inverted pulses have the same magnitude and polarity as the in-phase pulses, but "turn-on" when the in-phase pulses "turn-off" analogously to digital pulses sent through an inverting (not) gate. The inventive H-bridge design permits a comparatively simple circuit which adjusts the pulse width of an in phase pulse and phase-inverted pulses by slightly altering the rise and fall time of the two sets of pulses. Also, the inventors believe that the all n-channel transistor output stage is particularly well-suited for a pulse trimming mode of operation. The all n-channel H-bridge amplifier has the advantage that the "high" side transistors tend to naturally turn off slightly faster than the "low" side transistors turn on. This natural response of the transistors of an n-channel H-bridge amplifier further facilitates the use of pulse trimming.

An all n-channel H-bridge amplifier output stage 46 shown in FIG. 10 has both PWM 78 and phase inverted PWM 80 signals applied to its transistors. Crowbar currents may be reduced by using a drive circuit which includes a break-before-make response such that the PWM pulses 78 and phase inverted PWM pulses 80 entering the H-bridge amplifier output stage 146 are trimmed slightly in width with respect to each other.

According to the present invention crowbar currents are reduced using a driver circuit in which when the positive PWM signal 78 is turned off, the inverted PWM signal 80 is not turned on for a time period preferably on the order of 5-to-10 nanoseconds. However, while ten nanoseconds is the inventors preferred pulse trimming time for hearing aid applications, considerable variation in the pulse trimming period may provide benefits for different applications. Those of ordinary skill in the art of electronics design are presumed capable of calculating voltage rise and decay responses such that the tradeoffs between pulse trimming and crowbar currents may be analytically calculated for different pulse trimming periods. For low voltage applications the rise time is comparatively large such that a five-to-ten nanosecond pulse trimming period provides substantial performance benefits.

Figure 13:
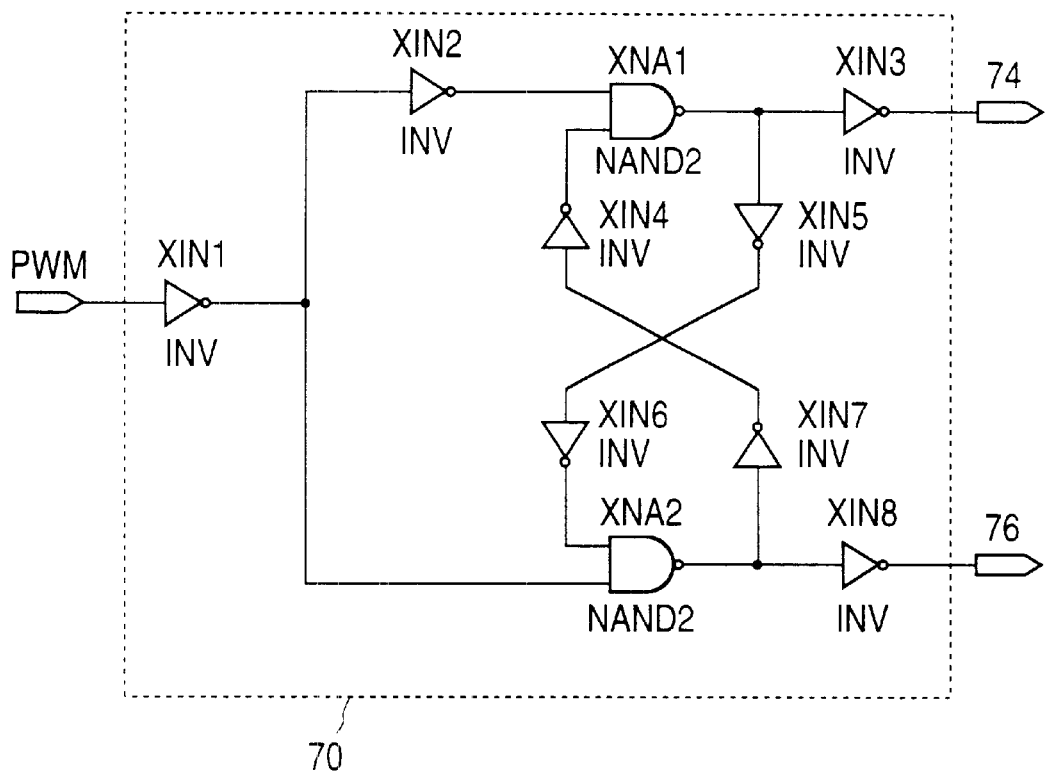
FIG. 13 is a circuit schematic of a pulse-trimming circuit.

A variety of circuits which alter the rise and fall times of input pulses may be utilized to fabricate a pulse trimmer. A suitable pulse trimming circuit 70 comprising a non-overlapping phase splitter is shown in FIG. 13. The circuit takes an input pulse width modulated signal and produces as outputs a normal 74 and an inverted 76 version of the PWM signal which are pulse trimmed with respect to each other. Some aspects of pulse trimming circuit 70 are similar to circuits designed to adjust the rise and fall times of pulses to prevent latchup of digital circuits.

FIG'S 9 and FIG. 10 show two different embodiments of portions of a driver circuit 44 with a pulse trimming element 70 and voltage multipliers 72 using the inventive capacitor structure are utilized to drive an all n-channel H bridge output stage 146. FIG. 9 shows an embodiment in which the N-channel transistors of output stage 146 are powered by inputs $V_{DD}$ and $V_{SS}$. The embodiment of FIG. 9 is thus consistent with powering the entire output stage from a polarity corrected source or from a battery of known polarity. FIG. 10 shows a preferred embodiment for use with a battery of variable polarity. As shown in FIG. 10, transistors 50-A, 50-B, 50-C, and 50-D of output stage 146 have their source/drain power connections made directly to battery connections $V_{BA}$ and $V_{BB}$. The use of an all n-channel transistor design renders the transistors polarity insensitive with respect to their main power connections. In particular, since all of the n-channel transistors are of the same type, their threshold voltages are uniform, which helps to make them polarity insensitive with respect to the main power connections. The inventors believe that it would be substantially more difficult to make a conventional Class D amplifier polarity insensitive with respect to its main power connections because of the differences in response of the n-type and p-type transistors and potential SCR latch-up problems.

The preferred embodiment of FIG. 10 produces a Class D amplifier with a low on-resistance. This improves the efficiency of the Class D amplifier by reducing the effective resistive losses, which include the series resistance of the battery, the series resistance of two n-channel transistors which are on at a particulary instant of time, and any other circuit elements in series with the amplifier. Also, the embodiment of FIG. 10 has the further advantage that it reduces the required size of the polarity correction circuitry. In hearing aids the output stage of a Class D amplifier commonly consumes up to 90% of the current (e.g., 10 mA) while other circuit elements, such as linear amplifiers, oscillators, and drivers consume only a small percentage of the total current requirements. Modifying the output stage to be polarity insensitive permits a great reduction in the size of polarity correction circuitry, which in the embodiment of FIG. 10 needs to be scaled to power only comparatively low current loads (i.e., loads requiring substantially less than 1 mA of total current). The driver circuit 44, for example, only requires a total drive current of 30-to-60 microamps compared to output stage currents of approximately 10-to-20 mA.

The embodiment of FIG. 10 also has superior spike noise behavior. Powering The n-channel H-bridge output stage 146 directly from the battery permits both a more efficient amplifier and also reduces the spike noise to other electronic circuits. This permits a substantial reduction in the size of filter capacitors and/or and improvement in the response of small signal linear amplifiers in an integrated hearing aid circuit.

The present invention encompasses many elements that can be used alone or in combination to improve the performance of an amplifier circuit. However, the inventors have recognized that it is preferable that all of these elements are used synergistically to achieve a substantial reduction in the total size of an integrated amplifier which is insensitive to battery polarity. This is crucial both in terms of cost and in terms of achieving a compact hearing aid circuit which can fit into the ear canal.

According to the teachings of the present invention, the total size of the integrated battery polarity insensitive amplifier may be substantially reduced if: 1) the power management architecture of the present invention is used to supply the currents of small-current elements, such as oscillators and drivers; 2) an all n-channel totem-pole output stage is used in which the transistors are directly powered by the battery; 3) the n-channel totem-pole transistors of the output stage are designed to have a small gate capacitance that must be charged (e.g., the transistors have a small total gate area); 4) charge pumps are used to substantially increase the gate voltages of the output stage transistors above the rail voltages; and 5) the charge pumps utilize capacitors with a high capacitance per unit area (e.g., an ultra-thin EEPROM oxide is used). All of these factors working together permits the integrated amplifier to be reduced to a size significantly less than the industry standard for in-the-canal hearing aids while also leaving room for other valuable electronic functions.

The inventors believe that the above-described five factors lead to a design window in which the total size of the circuit may be dramatically reduced. Reducing the size of the polarity correction function is one key aspect of achieving a compact integrated circuit. This is partially the result of directly powering the n-channel output stage transistors from the battery, which eliminates the need for a large polarity correction circuit to power the output stage transistors. However, it is also the result of utilizing comparatively high-conductivity n-channel transistor polarity adjusted voltage sources to power other electronic functions, such as driver circuits. The comparativly high conductivity of the n-channel transistors in the polarity adjusted voltage source permits at least a factor of four improvement in area compared to driving small current loads from conventional polarity correction circuits. The inventive power management approach reduces the size of the circuitry required to achieve a polarity correction function for a hearing aid by a factor of at least nine compared with previous polarity correction approaches used in hearing aids.

Another key aspect is interactively designing the output stage and the driver stage so that the total size of the driver and output stage is reduced. The conductance per unit width of an n-channel transistor is proportional to the term: $2(V_{GS}-V_T)-V_{DS}$. An charge pump which increases the gate-source voltage of an n-channel MOSFET increases the conductance per unit width. For a constant on-resistance, increasing the gate-source voltage permits the width of the n-channel transistors to be reduced. The transistor sizes decrease very rapidly with increasing gate voltage. However, the charge pump must have capacitors large enough in area to supply the charge on the gates associated with the increased gate-source voltage. Moreover, the charge pump capacitors must be large enough to provide the charge in the required rise time. The total circuit size to achieve a constant on-resistance may increase, remain the same, or decrease depending upon the size of the charge pump circuitry and the n-channel transistors.

The inventors have recognized that for some choices of transistor and charge pump parameters, a significant reduction in total circuit size may be achieved. For example, the use of charge pumps does not result in significant reduction in circuit size if the n-channel transistors have a comparatively large capacitance per unit of gate width (i.e., wide gates) and the charge pumps are inefficient and/or utilize capacitors that have a comparatively low capacitance per unit of area. However, the inventors have realized that there are design choices which substantially reduce the total size of the circuit. These design choices correspond to n-channel transistors that have a comparatively low capacitance per unit of gate width in combination with a relatively efficient voltage doubling or voltage tripling charge pump utilizing capacitors that have a comparatively high capacitance per unit of area.

Those of ordinary skill in the art of semiconductor device operation are presumed capable of analytically calculating the tradeoffs between driver structure and output stage performance. However, a first order approximation can be used to demonstrate some of the tradeoffs. As previously discussed, at low gate-source voltages, a MOSFET has a differential conductance that is proportional to the term $(V_{GS-VT}$. Or in other words, for a constant on-resistance the area of the n-channel transistors will be inversely proportional to $V_{GS}-V_T$. A small increase in gate source voltage directly increases the conductance per unit width of the MOSFET proportional to the increase in voltage, $\Delta V_{GS}$. According to elementary semiconductor physics, a corresponding differential charge must be deposited onto the gate capacitance, or $\Delta V_{GS}=\Delta Q_G/(C_{GS}W_G)$, where $\Delta Q_G$ is the differential charge deposited on the gate. $C_{GS}$ is the gate capacitance per unit width of gate, and $W_G$ is the gate width. The differential charge supplied by the charge pump can be approximated by: $\Delta Q_P = \Delta V_{CP} C_P A_P$ where $\Delta Q_P$ is the differential charge on the charge pump capacitors, $\Delta V_{CP}$ is the effective differential change in voltage on a charge pump capacitor, $C_P$ is the effective capacitance per unit area of a charge pump capacitors, and $A_P$ is the area of the charge pump. Balancing the differential charge gained on the gate with the charge supplied by the charge pump results in the expression: $\Delta V_{GS} = \Delta V_{CP} C_P A_P / (C_{GS} W_G)$.

The area of the n-channel transistors can be reduced proportional to an increase in $\Delta V_{GS}$, which increases the transistor conductivity. This can be expressed as $\Delta Ao = k \Delta V_{CP} C_P A_P / (C_{GS} W_G)$, where k is a constant related to the transistor design and $\Delta Ao$ is the differential decrease in the area of the output stage made possible by the increase in gate source voltage. However the area of the drive circuit is increased by the area of the charge pump capacitors, $A_P$. The differential area of the driver and the output stage is thus $\Delta Ac = \Delta Ao + A_p = A_p (1 - k \Delta V_{CP} C_P / (C_{GS} W_G))$. If the contributions of fringing fields to gate capacitance are ignored, the gate capacitance per unit of gate width is equal to an equivalent gate capacitance per unit of gate area multiplied by the gate length, or $C_{GS} = C'_{GS} L$, where L is the gate length and $C'_{GS}$ is the gate capacitance per unit of gate area. Thus, the differential area can be expressed as $\Delta Ac = A_p (1 - k \Delta V_{CP} C_P / (C'_{GS} L))$. From the above equations, a useful criteria for reducing the total area of the driver and the output stage is that the ratio $C_P / C'_{GS} L$ is large, which has the effect of favoring a decrease in the total area of the driver and output stage. It is thus desirable to utilize n-channel transistors with a comparatively narrow gate length and/or design the dielectric structure of the charge pump capacitors so that the charge pump capacitors have a substantially higher capacitance per unit of area than the gate capacitor of the output stage transistors.

In a preferred embodiment of the present invention, the gate capacitance of the n-channel transistors 50 of the Class D amplifier is selected to be low by using a one-to-two micron gate length CMOS process with a gate width less than 2000 microns. Also, it is desirable to select other aspects of the MOSFET structure, such as oxide thickness and/or doping to achieve a comparatively low capacitance. For example, the CMOS process utilized by the inventors results in a gate-source capacitance of about 0.08 femto-farads per square micron of gate area. Those of ordinary skill in the art of CMOS design are presumed familiar with the tradeoffs between MOSFET performance and design choices which affect the gate capacitance of a MOSFET transistor. The ratio of the capacitance of the inventive capacitor to the gate-source capacitance of the output stage transistors is about 50, which makes it extremely favorable to use charge-pumps, particularly if the gate length is less than about two microns and preferably less than one and a half microns. However, a substantial reduction in size will still occur if a charge pump capacitance of 3 femto-farads per square micron and a gate-source capacitance of 0.12 femto-farads per square microns is used. Moreover, a significant reduction in size will occur even for a charge pump capacitance of 2 femto-farads per square micron and a gate-source capacitance of about 0.15 femto-farads per square micron.

The combination of features of the present invention permits a hearing aid to operate properly regardless of battery polarity while also simultaneously resulting in a substantial reduction in size and improvement in the efficiency of the hearing aid circuit. Total circuit sizes of different amplifier configurations depend upon many design choices such as MOSFET doping profiles and gate lengths. Also, particular design choices of different designs reflect somewhat difference selections for the on-resistance of a Class-D amplifier. The inventors have performed calculations to asses the size reduction associated with their design approach assuming a modern one-micron CMOS MOSFET design and circuit design choices consistent with a constant on-resistance for Class D operation. For comparison purpose, the area associated with a given circuit element can be described in terms of a number of unit cells. For a conventional Class-D amplifier, 120 unit cells are required for the output stage and another 54 cells for the associated driver circuitry, for a total of 174 unit cells. For the all n-channel Class D-amplifier of the present invention, the output stage requires 32 unit cells of area, the driver circuitry requires 12 units of area, and an additional 32 units is required with the capacitors for the charge pumps, for a total of 76 units of area. Thus the all n-channel Class D-amplifier incorporating the preferred capacitor structure requires only about 44% the area of a conventional Class D amplifier. A substantial reduction in size is achieved in the inventive n-channel Class D amplifier because the extra increase in size associated with the capacitors used in the voltage multiplier is more than offset by the reductions in size achieved in the output stage. However, conventional capacitor structures, such as those with a capacitance per unit area about one-fourth of the present invention, would require significantly larger capacitors such that only a slight decrease in total circuit size would result. Calculations by the inventors indicate that substantial reductions in the total size of the inventive Class D amplifier are the result of a combination of the comparatively high capacitance per unit area of the preferred capacitors used in the voltage multipliers and the comparatively low gate capacitance of the MOSFET transistors, which is associated with their comparatively small gate length (i.e., about one micron). For example, in the above-described example, only about a 1% decrease in total circuit size results if conventional capacitor structures, which require about four times the area to achieve a comparable capacitance, are utilized.

The power management approach of the present invention results in further size reductions in the context of a Class D amplifier which is insensitive to battery polarity. The inventors have also calculated the total size, in terms of unit cells, for a conventional Class D amplifier assuming that it was successfully integrated onto the same chip as a conventional polarity correction circuit with a sufficient size to power the Class D amplifier from a low voltage battery. As in the previous example, a constant one-micron gate length CMOS process is assumed. A direct integration of a conventional Class D amplifier and a conventional polarity correction circuit results in an integrated circuit requiring 120 unit cells for the output stage, 54 unit cells for the driver stage, and 300 unit cells for the polarity correction circuitry, for a total of 474 unit cells of area. By way of comparison, the design approach of the preferred embodiment of the present invention requires an output stage of 32 cell units, a driver circuit consuming 12 cell units, a voltage multiplier capacitor of 32 cell units, and a voltage polarity correction circuitry requiring 36 unit cells, for a total of 112 unit cells.

The above-calculations indicate that the total size of the inventive polarity insensitive Class D amplifier is only about 24% as large as that which would be achieved if conventional Class D amplifiers and conventional polarity correction circuits could be directly integrated together. Moreover, the inventive Class D amplifier with polarity correction is 64% as large as conventional Class D amplifiers having no polarity correction function. Since the price of an integrated circuit is proportional to its chip area, this means that the inventive Class D amplifier which is efficient, has excellent noise properties, and which is polarity insensitive is potentially less expensive to manufacture than conventional Class D amplifiers lacking a polarity correction function.

The size reduction afforded by the present invention is particularly significant in the context of miniature hearing aids, because it permits an H-bridge amplifier which functions properly regardless of battery polarity to be integrated with other valuable electronics such that the electronics package fits into the ear canal. By way of comparison, the only other known way to integrate an H-bridge amplifier and polarity correction function into the same space is to "stack" several discrete chips into the same space as part of a hybrid circuit. However, this approach is expensive, has a low yield, and has other previously described disadvantages.

The present inventive hearing aid also has many other performance advantages compared to conventional Class D amplifier used in hearing aids. The power dissipation is reduced by a factor of two compared to conventional Class D amplifiers powered by low voltage batteries. The sound quality is improved, which the inventors attribute to improved isolation of spike noise from the H-bridge amplifier to other circuit elements and the reduction of crowbar currents. Additionally, the fabrication yield is high, even though there are more transistors, because the transistor sizes are reduced by approximately 75% compared with state-of-the-art CMOS hearing aid designs. The inventors believe that one reason the device yield is high is that the preferred EEPROM capacitor structure has a production yield, per unit of area, as high or higher than that of the n-channel MOSFETs. Consequently, even though the present invention incorporates charge pumps to reduce the size of the n-channel transistors, the yield is high.

The present invention is also consistent with integrating the hearing aid with other valuable electronic functions on the same chip because of the compact size and high yield. Generally, the power management approach of the present invention can be extended to other circuit blocks within an integrated circuit. For example, the present invention is consistent with incorporating signal processing elements, such as digital signal processing (DSP) elements, into the same chip.

While the present invention is particularly directed towards the problems of miniature hearing aids, the inventors believe that there are other integrated circuit applications for which the teachings of the present invention are applicable. In particular, there is a general push to miniaturize a variety of audio devices such as stereos and recorders. Also, numerous other structures, such as piezoelectric micromoters, are also being miniaturized. Many of the bottlenecks to further miniaturization of such devices are the same as for hearing aids; efficiently managing limited battery voltage and power and designing circuits to operate properly regardless of the polarity of miniature batteries. An integrated circuit design approach that permits 1 V blank-faced miniature batteries to be advantageously used in a variety of circuits thus has many applications. Also, many audio devices, such as compact portable stereos, would also benefit by incorporating the efficient Class D amplifier of the present invention. Also, the inventive voltage multiplier may have applications to programming EEPROM memory cells. In particular, the inventive voltage multiplier, which can multiply a nominal one volt source up to 12.5 volts, produces a sufficiently high voltage to program a variety of EEPROM devices.

In summary, the present invention comprises both a battery polarity power management approach and an efficient Class-D amplifier design that is polarity insensitive with respect to the power connections made to the source-drain contacts of its transistor switches. The battery polarity reversal power management approach of the present invention permits a substantial reduction in the size of a battery polarity correction function. A compact polarity corrected voltage source is used to initially bias the substrate. This prevents body-steering problems, such as CMOS threshold voltage variations, associated with a variable substrate polarity. The polarity corrected voltage source is also used to provide power and reference signals to other circuit elements, such as a polarity control circuit. A polarity control circuit, acting in response to reference signals from a polarity corrected voltage source, provides control signals which act to correct the polarity of an polarity adjustable voltage source. The polarity adjustable voltage source preferably comprises a circuit with a low series resistance, such as an all n-channel MOSFET bridge circuit. The Class D amplifier of the present invention comprises four transistor switches, preferably of the same transistor type, arranged into an H-bridge configuration. The total size of the amplifier circuit is reduced by utilizing high conductivity n-channel transistors in combination with voltage multiplying charge pump circuits to drive the gate voltages into the ohmic region. A substantial reduction is circuit size is achieved by simultaneously reducing the capacitance of the transistors while utilizing charge pump circuits with a comparatively large capacitance per unit area. A particularly useful capacitor structure for low voltage applications comprises a sandwich structure with at least on ultra-thin oxide layer, such as an eighty Angstrom oxide layer. An additional improvement in low voltage Class-D amplifier performance is also achieved by trimming the pulse width of signals to the transistors to reduce parasitic crowbar currents.

Although a preferred embodiment of the present invention and modifications thereof have been described in detail herein, it is to be understood that this invention is not limited to those precise embodiments and modifications, and that other modifications and variations may be affected by one of ordinary skill in the art without departing from the spirit and scope of the invention as defined in the appended claims.

What is claimed is:

1. A compact integrated circuit transient voltage multiplier for increasing the voltage of input pulses, comprising:

a plurality of switching transistors;

at least one capacitor comprising a silicon dioxide dielectric layer less than about 200 Angstroms in thickness sandwiched between a conductive polysilicon layer and an n-type doped surface region disposed in a conductive p-substrate region; and electrical connections between said transistors and said capacitors;

wherein said switching transistors charge said capacitors to a voltage value substantially below the tunneling voltage of said dielectric layer and said capacitors are biased so that said n-type doped surface region forms a reverse-biased varactor diode with the p-substrate, said switching transistors acting so that the voltage of the input pulses is increased by a voltage contribution from each said capacitor.

2. The voltage multiplier of claim 1, wherein the dielectric region of said capacitor is less than about one-hundred Angstroms in thickness.

3. The voltage multiplier of claim 1, wherein said capacitor further comprises alternating layers of silicon dioxide and conductive polysilicon layers disposed on said polysilicon layer, said conductive layers interconnected with said n-type doped region and said polysilicon layer so that a single capacitor is formed.

4. The voltage multiplier of claim 1, wherein the doping profile of said n-type surface region varies with distance from the surface of the substrate so that a n+/n−/p− varactor diode is formed with said substrate.

* * * * *